US00RE47816E

(19) United States
(12) Reissued Patent
Rhie

(10) Patent Number: US RE47,816 E
(45) Date of Reissued Patent: Jan. 14, 2020

(54) THREE-DIMENSIONAL NONVOLATILE MEMORY CELL STRUCTURE WITH UPPER BODY CONNECTION

(71) Applicant: Conversant Intellectual Property Management Inc., Ottawa (CA)

(72) Inventor: Hyoung Seub Rhie, Ottawa (CA)

(73) Assignee: Conversant Intellectual Property Management Inc., Ottawa (CA)

(21) Appl. No.: 15/869,245

(22) Filed: Jan. 12, 2018

Related U.S. Patent Documents

Reissue of:
(64) Patent No.: 9,236,394
Issued: Jan. 12, 2016
Appl. No.: 14/532,048
Filed: Nov. 4, 2014

U.S. Applications:
(60) Provisional application No. 61/901,830, filed on Nov. 8, 2013.

(51) Int. Cl.
*G11C 16/00* (2006.01)
*G11C 16/26* (2006.01)
(Continued)

(52) U.S. Cl.
CPC .... *H01L 27/11556* (2013.01); *G11C 16/0408* (2013.01); *G11C 16/0483* (2013.01);
(Continued)

(58) Field of Classification Search
CPC ..... H01L 23/485; H01L 27/101; H01L 27/10864; H01L 27/11551; H01L 27/11556; H01L 27/11565; H01L 27/1157; H01L 27/11578; H01L 27/11582; H01L 21/28282; H01L 27/11573; G06F 21/79; G11C 7/062; G11C 11/5628; G11C 16/02;
(Continued)

(56) References Cited

U.S. PATENT DOCUMENTS 5,907,170 A * 5/1999 Forbes ..... H01L 27/10864 257/296
6,643,159 B2 * 11/2003 Fricke ..... G11C 5/025 257/E21.614
(Continued)

OTHER PUBLICATIONS

Y. Fukuzumi et al., Optimal Integration and Characteristics of Vertical Array Devices for Ultra-High Density, Bit-Cost Scalable Flash Memory, IEEE International Electron Devices Meeting, 2007, Dec. 10-12, 2007, pp. 449-452.
(Continued)

*Primary Examiner* — Christopher E. Lee
(74) *Attorney, Agent, or Firm* — Conversant IP Management Corp.

(57) ABSTRACT

A three-dimensional integrated circuit non-volatile memory array includes a memory array of vertical channel NAND flash strings connected between a substrate source line and upper layer connection lines which each include n-type drain regions and p-type body line contact regions alternately disposed on each side of undoped or lightly doped string body regions so that each NAND flash string includes a vertical string body portion connected to a horizontal string body portion formed from the string body regions of the upper body connection lines.

26 Claims, 14 Drawing Sheets

(51) Int. Cl.

| | |
|---|---|
| ***H01L 29/792*** | (2006.01) |
| ***H01L 27/115*** | (2017.01) |
| ***G11C 16/04*** | (2006.01) |
| ***G11C 16/14*** | (2006.01) |
| ***H01L 27/11556*** | (2017.01) |
| ***H01L 27/11524*** | (2017.01) |
| ***H01L 27/11582*** | (2017.01) |
| ***H01L 27/1157*** | (2017.01) |

(52) U.S. Cl.
CPC ..... *G11C 16/14* (2013.01); *G11C 16/26* (2013.01); *H01L 27/1157* (2013.01); *H01L 27/11524* (2013.01); *H01L 27/11582* (2013.01); *H01L 29/7926* (2013.01)

(58) Field of Classification Search
CPC ..... G11C 16/04; G11C 16/0483; G11C 16/16; G11C 5/025
USPC ..... 257/66, 296, 302, 314, 315, 321, 324, 257/774, 786, 208, E21.614; 365/130, 365/148, 185.02, 185.03, 185.17, 185.18, 365/185.33, 185.29; 713/193
See application file for complete search history.

(56) References Cited

U.S. PATENT DOCUMENTS 7,692,950 B2 * 4/2010 Rhie ..... H01L 27/101 365/148
7,852,676 B2 12/2010 Maejima
7,994,011 B2 8/2011 Park et al.
8,188,530 B2 * 5/2012 Tanaka ..... H01L 27/11573 257/314
8,199,573 B2 6/2012 Fukuzumi et al.
8,427,881 B2 * 4/2013 Jang ..... G11C 16/0483 365/185.02
8,531,901 B2 * 9/2013 Ogiwara ..... G11C 16/30 365/185.17
8,587,998 B2 * 11/2013 Hung ..... G11C 16/0483 365/130
8,891,300 B2 * 11/2014 Oh ..... G11C 11/5628 365/185.03
9,070,442 B2 * 6/2015 Yip ..... G11C 16/02
9,076,879 B2 * 7/2015 Yoo ..... H01L 27/1157
2006/0138522 A1 * 6/2006 Kim ..... H01L 27/115 257/315
2006/0237851 A1 * 10/2006 Ko ..... H01L 23/485 257/774
2009/0173981 A1 * 7/2009 Nitta ..... H01L 21/84 257/302
2010/0208511 A1 * 8/2010 Rhie ..... G11C 7/062 365/148
2010/0224928 A1 * 9/2010 Fukuzumi ..... H01L 21/28282 257/324
2010/0265773 A1 10/2010 Lung et al.
2011/0024816 A1 * 2/2011 Moon ..... H01L 27/11578 257/314
2011/0051527 A1 * 3/2011 Kirisawa ..... G11C 16/0483 365/185.29
2011/0147824 A1 * 6/2011 Son ..... G11C 16/0483 257/324
2011/0157989 A1 * 6/2011 Iwata ..... G11C 16/0483 365/185.17
2011/0216597 A1 * 9/2011 Higashi ..... H01L 27/11582 365/185.18
2011/0284946 A1 * 11/2011 Kiyotoshi ..... H01L 27/11565 257/324
2011/0298013 A1 * 12/2011 Hwang ..... H01L 27/11551 257/208
2012/0033503 A1 * 2/2012 Kim ..... G11C 16/16 365/185.33
2012/0043673 A1 * 2/2012 Chang ..... H01L 27/11551 257/786
2012/0132981 A1 * 5/2012 Imamura ..... H01L 27/11556 257/321
2012/0248525 A1 * 10/2012 Lee ..... H01L 27/11582 257/354
2013/0016561 A1 1/2013 Nam
2013/0069141 A1 * 3/2013 Pan ..... G11C 5/02 257/324
2013/0248974 A1 * 9/2013 Alsmeier ..... G11C 16/04 257/321
2013/0264631 A1 10/2013 Alsmeier et al.
2013/0286735 A1 * 10/2013 Hwang ..... H01L 27/11551 365/185.05
2014/0047246 A1 * 2/2014 Seol ..... G06F 21/79 713/193
2014/0252363 A1 * 9/2014 Liu ..... H01L 27/11556 257/66
2014/0307508 A1 * 10/2014 Rhie ..... G11C 16/0483 265/185.17
2015/0115344 A1 * 4/2015 Lai ..... H01L 27/11565 257/314

OTHER PUBLICATIONS

J. Jang et al., Vertical Cell Array using TCAT(Terabit Cell Array Transistor) Technology for Ultra High Density NAND Flash Memory, 2009 Symposium on VLSI Technology Digest of Technical Papers, Jun. 16-18, 2009, pp. 192-193.
R. Katsumata et al., Pipe-shaped BiCS Flash Memory with 16 Stacked Layers and Multi-Level-Cell Operation for Ultra High Density Storage Devices, 009 Symposium on VLSI Technology Digest of Technical Papers, Jun. 16-18, 2009, pp. 136-137.
Y. Kim et al., Three-Dimensional NAND Flash Architecture Design Based on Single-Crystalline STacked ARray, IEEE Transactions on Electron Devices, vol. 59, No. 1, Jan. 2012.
Y. Komori et al., Disturbless Flash Memory due to High Boost Efficiency on BiCS Structure and Optimal Memory Film Stack for Ultra High Density Storage Device, IEEE International Electron Devices Meeting, 2008,Dec. 15-17, 2008 pp. 1-4.
H-T Lue et al., A Highly Scalable 8-Layer 3D Vertical-Gate (VG) TFT NAND Flash Using Junction-Free Buried Channel BE-SONOS Device, 2010 Symposium on VLSI Technology Digest of Technical Papers, Jun. 15-17, 2010 pp. 131-132.
H. Tanaka et al., Bit Cost Scalable Technology with Punch and Plug Process for Ultra High Density Flash Memory, 2007 Symposium on VLSI Technology Digest of Technical Papers, Jun. 12-14, 2007, pp. 14-15.

* cited by examiner

THREE-DIMENSIONAL NONVOLATILE MEMORY CELL STRUCTURE WITH UPPER BODY CONNECTION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS REFERENCE TO RELATED APPLICATIONS*

*This application is a Reissue of U.S. patent application Ser. No. 14/532,048 filed Nov. 4, 2014, now issued as U.S. Pat. No. 9,236,394, this application claims the benefit to Provisional Application No. 61/901,830, filed Nov. 8, 2013, all of which are incorporated by reference herein.*

BACKGROUND OF THE INVENTION

1. Field of the Invention

The present invention is directed in general to integrated circuit devices and methods for manufacturing same. In one aspect, the present invention relates to nonvolatile memory devices, such as NAND flash memory and other types of flash memory.

2. Description of the Related Art

With the increasing demand for nonvolatile data storage in consumer electronics having mass storage, such as video or audio players, digital cameras, and other computerized devices, there continues to be interest in having nonvolatile memory devices progress over time towards having smaller sizes, larger memory capacity, and improved performance. Flash memory is a commonly used type of nonvolatile memory which can take the form of memory cards or USB type memory sticks, each having at least one memory device and a memory controller formed therein. For example, the need to reduce manufacturing costs per data bit is driving the NAND flash industry to continuously reduce the size of the cell transistors. But as fabrication process limitations (for example, limitations imposed by photolithography tools) limit the ability to reduce physical transistor sizes, there have been structural and/or design schemes proposed to increase memory density, such as, for example, stacking NAND cells in a direction perpendicular to the chip surface, thereby reducing the effective chip area per data bit without requiring shrinkage of the physical cell transistor size. However, there continue to be challenges associated with designing, fabricating, and operating vertical NAND flash memory devices.

BRIEF DESCRIPTION OF THE DRAWINGS

The present invention may be understood, and its numerous objects, features and advantages obtained, when the following detailed description is considered in conjunction with the following drawings, in which:

FIG. 1b illustrates a simplified cross sectional view of the NAND flash memory cell transistors shown in FIG. 1a;

Figure 1A:
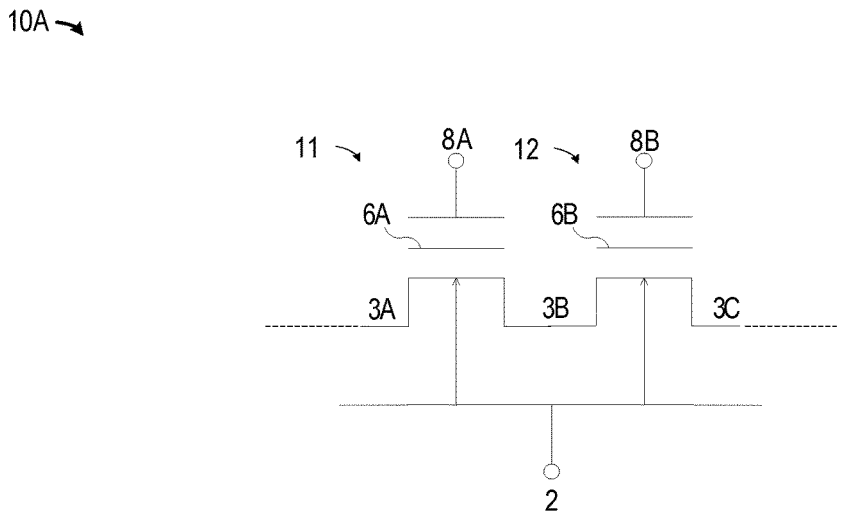
FIG. 1a illustrates a simplified circuit schematic representation of two serially-connected NAND flash memory cell transistors.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

In a three-dimensional vertical channel NAND flash memory device, a stacked memory architecture and cell array structure are provided with upper connection lines formed with semiconductor strips or in a single semiconductor layer. The upper connection lines include n-type bit line nodes for connection to vertical string channels through horizontal string body portions. The upper connection lines also include p-type body nodes for direct electrical connection to vertical string bodies through horizontal string body portions to provide direct charging through a common body node during erase operations. By connecting the flash cell strings between the upper connection lines and an n-type source line formed in the substrate, the transistors on each string may include a plurality of series-connected transistors, including a string select transistor having a drain which is electrically connected to an n-type bit line node of the upper connection line and a source which is connected to one out of multiple cell transistors connected in series through a ground select transistor to the n-type source line in the substrate. In selected embodiments, a plurality of upper connection lines running in the bit line direction is formed over a stacked array of vertical gate NAND flash cell strings, such as by depositing, patterning, and etching a polysilicon layer to form the plurality of upper connection lines, and then selectively implanting the upper connection lines to define alternating n-type bit line contact regions and p-type body contact regions which are laterally spaced apart from vertical string body portions of the underlying flash cell strings by horizontal string body portions formed in the upper connection lines. In other embodiments, the upper connection lines may be formed by depositing, patterning, and selectively implanting a polysilicon layer to form upper connection lines having implanted n-type bit line contact regions and p-type body contact regions which surround horizontal string body portions formed around vertical string body portions of the underlying flash cell strings. By forming and positioning each upper connection line to include a horizontal string body portion in direct electrical contact with a corresponding vertical string body portion, each semiconductor body of the cell array transistors is not confined to a straight pillar structure, and is connected to an n-type bit line contact region and p-type body contact region in a corresponding upper connection line. In addition, by forming n-type and p-type node regions in the upper connection lines after fabrication of the stacked cell structures to be laterally spaced apart from the vertical string bodies by the horizontal string body portions, the risk of dopant ion diffusion into the vertical string bodies may be reduced or eliminated.

In this disclosure, an improved system, apparatus, and fabrication method are described for fabricating vertical channel NAND flash memory devices with upper connection line structures and substrate source line regions positioned on opposing ends of adjacent NAND strings that address various problems in the art where various limitations and disadvantages of conventional solutions and technologies will become apparent to one of skill in the art after reviewing the remainder of the present application with reference to the drawings and detailed description provided herein. For example, there are performance limitations with performing erase operations in conventional floating-body type stacked NAND flash memories due to difficulties with directly charging cell bodies in such memories. There are also manufacturing challenges that can impair device performance, such as when source lines are implanted into the substrate through the stacked cell structures, resulting in increased resistance due to limited implantation area and/or dopant concentration. While there have been attempts to address such limitations, such solutions typically include doped n-type drain contact regions formed on top of the vertical string bodies, resulting in other technical challenges when dopants diffuse into the string body structures during high-temperature fabrication processing used to make stacked cell structures. Various illustrative embodiments of the present invention will now be described in detail with reference to the accompanying figures. While various details are set forth in the following description, it will be appreciated that the present invention may be practiced without these specific details, and that numerous implementation-specific modifications may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified drawings and representations of a flash memory device without including every device feature, geometry, or circuit detail in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art how to make or use the present invention.

To provide a contextual framework for selected embodiments of the present disclosure, reference is now made to FIG. 1a which illustrates a simplified circuit schematic representation 1 of two serially connected NAND Flash cell transistors 11, 12. Each of the transistors 11, 12 includes a control gate 8A, 8B and a floating node (or storage nodes) 6A, 6B. Source/drain nodes 3A, 3B, 3C and the cell body node 2 are also shown. The NAND flash memory cell transistors 11, 12 can perform erase, program, and read operations by applying appropriate voltages to the indicated nodes, thereby trapping electrons in the charge storage nodes 6A, 6B to modify the threshold voltage of each cell transistor to different levels, depending on the data (0 or 1) stored in the cell. The threshold voltage of each cell transistor determines the resistance of the corresponding channel 4A, 4B. In selected embodiments where each NAND Flash memory cell stores two logic states (data '1' and data '0'), each memory cell corresponds to one bit, but in other embodiments where NAND Flash memory cells can be programmed to four or more threshold levels, multiple bits can be stored in each physical cell, which is referred to as a multi-level cell (MLC). With NAND flash memory cells, data is typically erased and programmed using Fowler-Nordheim (F-N) tunneling to deliver or remove charge from the floating gate/charge storage nodes 6A, 6B by applying a suitably large voltage to the control gate 8A, 8B (for example, 20V) while holding the substrate 2 and source/drain regions 3 to a lower voltage (for example, ground or 0V) to induce the formation of a channel 4A, 4B under the tunnel dielectric 5 which injects electrons into the floating gate/charge storage nodes 6A, 6B. As a result, the cell threshold voltage Vth of the programmed cell is shifted in the positive direction.

In order to read cell data, the control gate 8A, 8B is biased to a lower voltage (for example, Vss=0V). If the cell is in an erased state, the erased cell has a negative threshold voltage so that the cell current (Icell) from the drain 3B to the source 3A flows under the given read bias condition. On the other hand, if the cell is in a programmed state, the programmed cell has a positive threshold voltage so that there is no cell current from the drain 3B to the source 3A under read bias condition. An erased cell (on-cell) is thus read or sensed as data '1' and a programmed cell (off-cell) is read or sensed as data '0'.

During an erase operation, the control gate 8A, 8B of a cell is biased to a low voltage (for example, Vss=0V) while the cell body 2 is biased to an erase voltage V_erase (for example 18 V) and the source and drain 3A/3B of the cell are floated. In the erase bias conditions, no conductive inversion layer channel 4A, 4B exists because the cell transistors are strongly turned off, in which case the trapped electrons in the floating node 6A, 6B are emitted uniformly to the substrate 2 through the tunnel dielectric 5. As a result, the cell threshold voltage (Vth) of the erased cell becomes negative. In other words, the erased cell transistor is in an on-state if the gate bias of the control gate is 0V. Because of the cell body bias requirement for erase bias conditions, erase operations are not applied to individual NAND Flash memory cells, but are instead applied to erase entire blocks of cells.

Figure 1B:
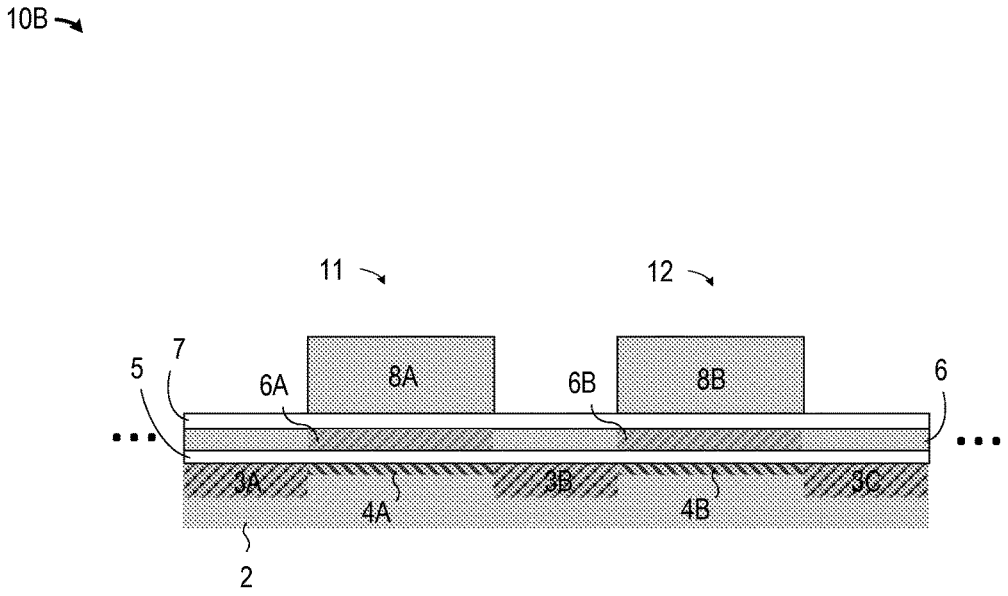

To further illustrate the contextual framework for selected embodiments of the present disclosure, reference is now made to FIG. 1b which illustrates a simplified cross sectional view of the NAND flash memory cell transistors 11, 12 shown in FIG. 1a formed in a semiconductor substrate or string structure. The illustrated NAND Flash cell includes a semiconductor body or well layer 2 formed with an appropriate semiconductor material (for example, monocrystalline or polycrystalline silicon) having a first polarity type (for example, p-type silicon), such as a bulk semiconductor substrate, semiconductor-on-insulator (SOI) substrate, or a polysilicon layer. Multiple semiconductor substrate or string structures can be vertically stacked over a bulk or SOI substrate and separated from one another by interlayer dielectric layers.

On or around the semiconductor body or well layer 2, a multi-layered memory film structure 5-7 is formed for each transistor 11, 12, including a tunnel dielectric layer 5 that is formed (for example, deposited or grown) on the semiconductor body/well layer 2, a charge storage layer 6 that is formed on the tunnel dielectric 5, and a coupling dielectric 7 (a.k.a., blocking dielectric) that is formed (for example, deposited) on the charge storage layer 6. Sandwiched between the tunnel dielectric layer 5 and the coupling dielectric layer 7, the charge storage layer 6 performs a charge trap function by including charge storage nodes or locations 6A, 6B where electrons are trapped. In selected embodiments, the charge storage nodes 6A, 6B may be formed as a SONOS (Silicon-Oxide-Nitride-Oxide-Silicon) structure, though other charge storage node structures may be used. As will be appreciated, the charge storage nodes 6A, 6B are formed to prevent unintentional charge flow between adjacent cells, such as by forming the charge storage layer 6 with dielectric charge trapping material or with conductive material in each cell which is isolated from adjacent cells (e.g., by patterned dielectric layers between adjacent floating gates). In selected floating gate embodiments (not shown), the charge storage layer 6 is patterned into separate floating gates that are isolated from one another. However, in embodiments where the charge storage layer 6 and storage nodes 6A, 6B are formed as a single continuous layer, the multi-layered memory film structure 5-7 may be fabricated as a continuous thin film without patterned, isolated segments. On the multi-layered memory film structure 5-7, patterned control gates 8A, 8B are formed, such as by depositing a polysilicon layer or other conductive control gate layer on the coupling dielectric 7.

In the semiconductor body/well layer 2, source/drain regions 3A-3C are formed using any desired technique. For example, the source/drain regions 3 may be formed by implanting or diffusing regions with appropriate polarity dopants (for example, n-type doping). In other embodiments, the source/drain regions 3 are not formed through ion implantation as permanently conducting implant regions, but instead have their conductivity controlled by applying electric fringe-fields from the control gates 8A, 8B. For example, a large bias applied at the control gates 8A, 8B can induce conductive inversion layers in the source/drain regions 3A-3C in the same manner as a channel inversion layer forms when a transistor is turned on. These types of cells are called "junction-free" or "junctionless" cells. In such junction-free cells, the channel regions 4A, 4B and the source/drain regions 3A, 3B, 3C are only conductive if the electric field between the charge storage node 6A, 6B and the substrate 2 is sufficiently large to induce an inversion layer. This electric field is caused by a combination of the charge stored in the charge storage layer 6A, 6B and the external bias that is applied to the control gate 8A, 8B.

Figure 2:
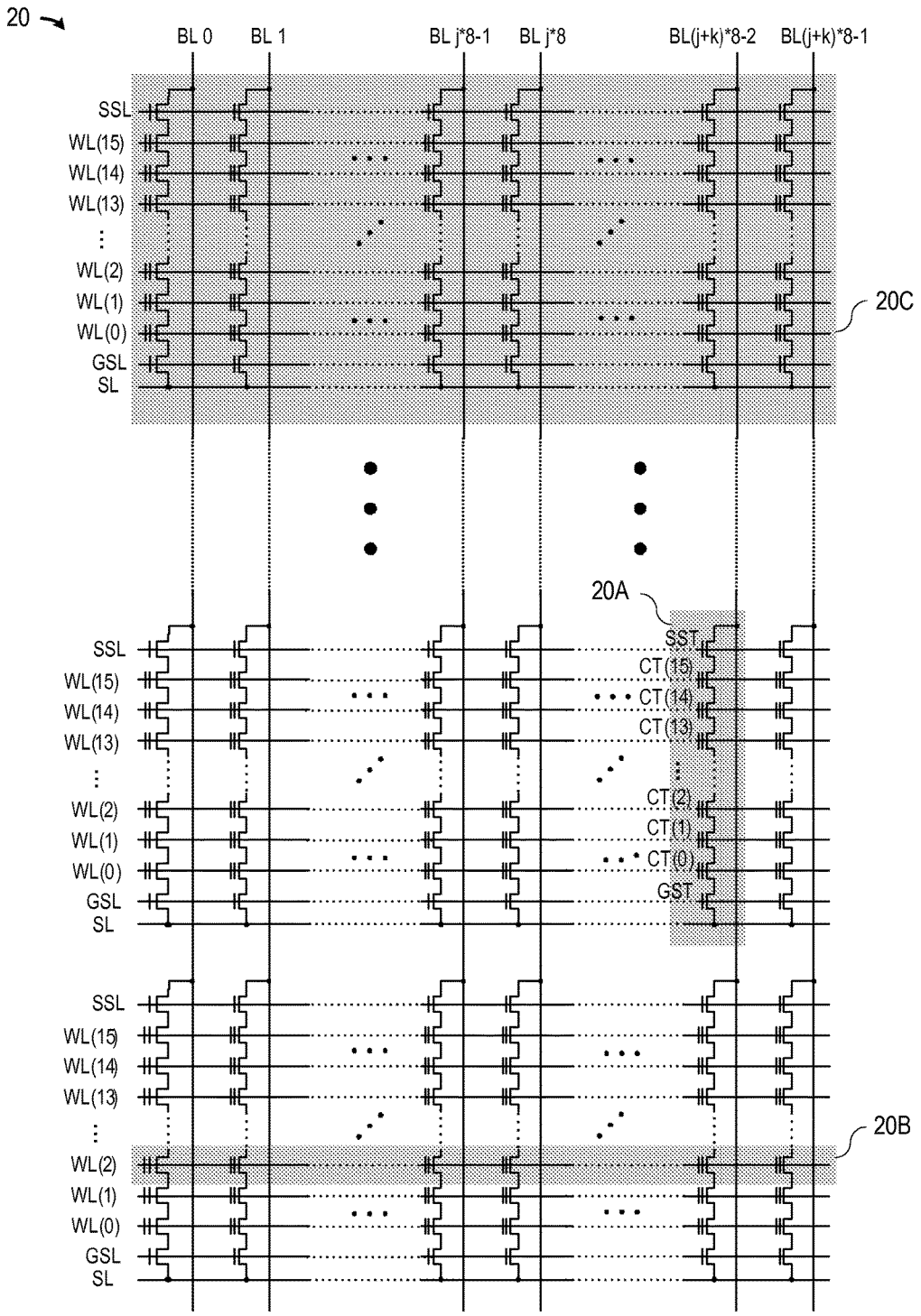
FIG. 2 illustrates a simplified circuit schematic representation of a NAND flash memory cell array in which a string, page, and block of data are identified.

Turning now to FIG. 2, there is shown a simplified circuit schematic of a plurality of NAND flash memory cells organized and arrayed into multiple rows and columns, where each column is connected to a respective bit line conductor (for example, BL0-BL(j+k)*8−1) and each row is connected to a respective word line conductor (for example, WL(0)-WL (15)). As depicted, the NAND flash memory cell array 20 can be subdivided into data strings, data pages, and data blocks, as illustrated by examples of a data string 20A, data page 20B, and data block 20C.

In the depicted NAND string 20A, the cells are connected in series in a group of a predetermined numbers of cells (for example, 16, 32 or 64). To connect each string to its corresponding source line (SL) and bit line (for example, BL(j+k)*8−2), selection transistors are placed at the edges of the string. For example, the NAND cell string 20A includes at least one string select transistor (SST, SSL gate or SSL transistor) and at least one ground select transistor (GST, GSL gate or GSL transistor). The gate of the string select transistor (SST) is connected to a string select line (SSL), while the drain of a string select transistor (SST) is connected to a bit line for the string (for example, BL(j+k) *8−2). The gate of a ground select transistor (GST) is connected to a ground select line (GSL), while the source of the ground select transistor (GST) is connected to a source line (SL or CSL) for the string. Connected in series between the string select transistor SST and ground select transistor GST is a plurality of memory cell transistors CT(i), each having a control gate connected to a respective word line WL(i). In the depicted configuration, the NAND string 20A shares the bit line contact with another string, and any desired number of memory cell transistors may be connected in a string so that the number of cells per string may vary with 4 cells per string, 8 cells per string, 16 cells per string, 32 cells per string, 64 cells per string, 128 cells per string, and so on. To specify a direction within the string 20A, the direction towards the string select line SSL of a string is referred to as "drain direction" or "drain side," and the direction towards the ground select line GSL of a string is referred to as "source direction" or "source side."

In the depicted NAND page 20B, the cells are addressed by a row address to specify the smallest unit of cells for which a read or program operation can be performed. In selected embodiments, the page 20B includes the cells connected to the same word line (for example, WL(2)). In other embodiments, the number of pages per word line depends upon the storage capabilities of the memory cell. For example, the cells connected to a certain word line may be subdivided into multiple subgroups so that the array 20 includes multiple pages per word line, whereby each one of the multiple pages in one word line has a different row address. In the case of multiple bit storage in one physical cell, different bits can belong to different pages although they are physically located in the same cell transistor and thus connected to the same word line.

The NAND Flash array 20 may also be grouped into a series of blocks (for example, 20C). For example, the depicted NAND flash block 20C includes all strings which share the same word lines, string select lines, and ground select lines. Stated another way, a block 20C includes all pages sharing the same string select lines and ground select lines. In other embodiments, different groupings of NAND flash cells may be used for the flash erase blocks. In selected embodiments, the smallest unit for which an erase operation is performed is one cell block, which is therefore often named "erase block."

Figure 3:
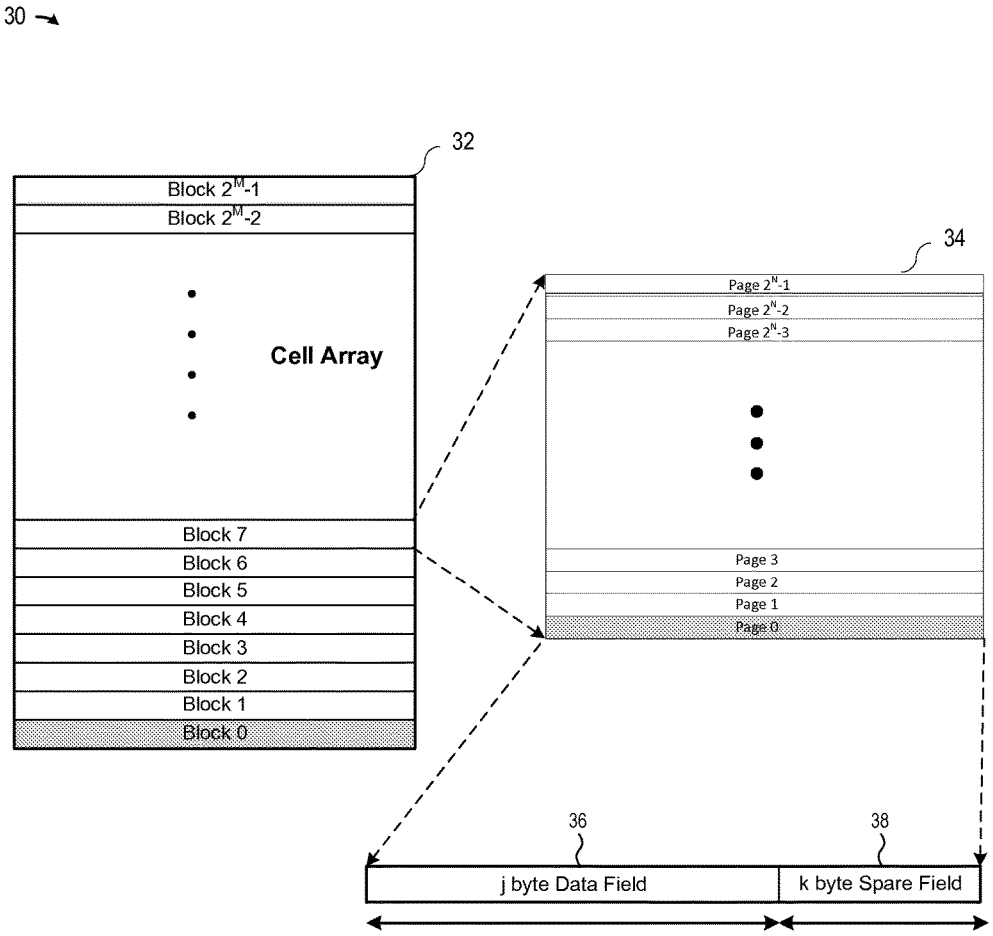
FIG. 3 illustrates a multi-block NAND flash cell array memory using block and page addressing to support read, program, and erase operations.

To illustrate the block-base erase operations for a NAND flash array, reference is now made to FIG. 3 which shows a multi-block NAND flash memory 30 which uses block and page addressing to support read, program, and erase operations. As depicted, the flash memory 30 is organizationally divided in blocks 32 and pages 34. The depicted flash memory 30 includes $2^M$ blocks, though more generally, there may be power of two blocks within any flash memory. Each block (for example, Block 7) contains multiple pages 34 which are typically 64, 128 or more generally, $2^N$ pages in each block. Again, a page is the smallest addressable unit for reading and writing, and may include a main area for storing data and a spare area for error correction, system pointers, and/or other information relating to the data stored in the main area. Assuming that the row address contains M bits for the block address and N bits for the page address, the multi-block NAND flash memory 30 includes $2^M$ erase blocks, with each block subdivided into $2^N$ programmable pages. Each page (for example, Page 0) includes (j+k) bytes (times 8 bits) which are divided into a j-byte data storage region or data field 36 and a separate k-byte area or spare field 38 which is typically used for error management functions. As seen in the embodiment of FIG. 3, one page=(j+k) bytes, one block=$2^M$ pages=(j+k) bytes*$2^M$, and the total memory array size=$2^N$ blocks=(j+k) bytes*$2^{M+N}$.

Figure 4:
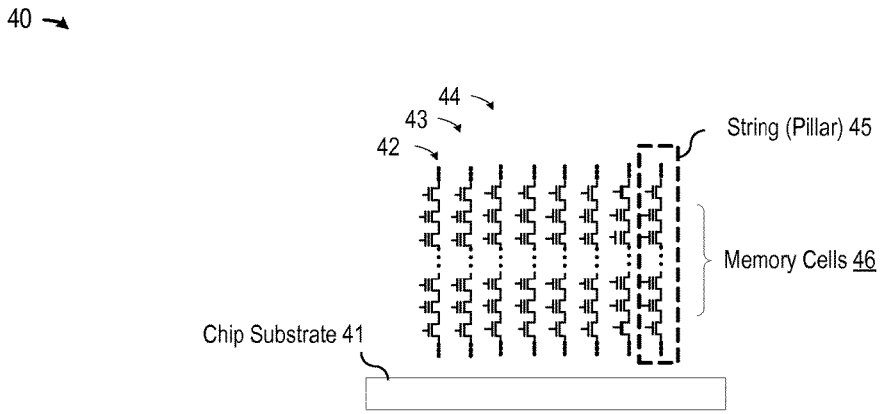
FIG. 4 illustrates a simplified cross-sectional schematic representation of a vertically stacked array of vertical channel NAND flash cell strings formed over a substrate.
Figure 5:
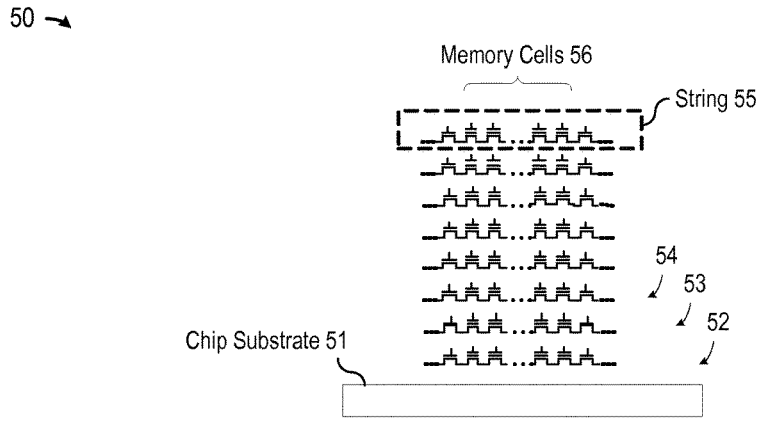
FIG. 5 illustrates a simplified cross-sectional schematic representation of a vertically stacked array of vertical gate NAND flash cell strings formed over a substrate.

As memory array sizes increase, the need to reduce manufacturing costs per data bit is driving the NAND Flash industry to continuously reduce the size of the cell transistors. Due to the limitations imposed by photolithography tools and the limits of shrinking the physical transistor size, schemes have been proposed whereby NAND cells are stacked in a direction perpendicular to the chip surface. Thereby, the effective chip area per data bit can be reduced without relying on the shrinkage of the physical cell transistor size. Generally speaking, there are two main types of stacked NAND flash memory device architectures. First, and as illustrated in simplified cross-sectional schematic form in FIG. 4, a vertically stacked array 40 may be fabricated with vertical channel NAND flash cell strings 42-45 formed over a substrate 41 to run in a direction that is perpendicular or orthogonal to the chip substrate 41. In the vertical channel NAND architecture, the memory cells 46 belonging to the same string are stacked vertically on top of each other, and different strings 42-45 are arranged as pillars that are laterally positioned next to one another. By convention, the device architecture for the vertically stacked array 40 may be referred to as Vertical Channel NAND or VC NAND. Second, and as illustrated in simplified cross-sectional schematic form in FIG. 5, a vertically stacked array 50 may be fabricated with vertical gate NAND flash cell strings 52-55 formed over a substrate 51 to run in a direction that is parallel to the chip substrate 51. In this architecture, memory cells 56 belonging to the same string (for example, 52) are aligned in a direction parallel to the chip surface as in conventional planar NAND cells, but additional strings (for example, 53-55) are stacked vertically on top of each other. By convention, the device architecture for the vertically stacked array 50 may be referred to as Vertical Gate NAND or VG NAND.

Figure 6:
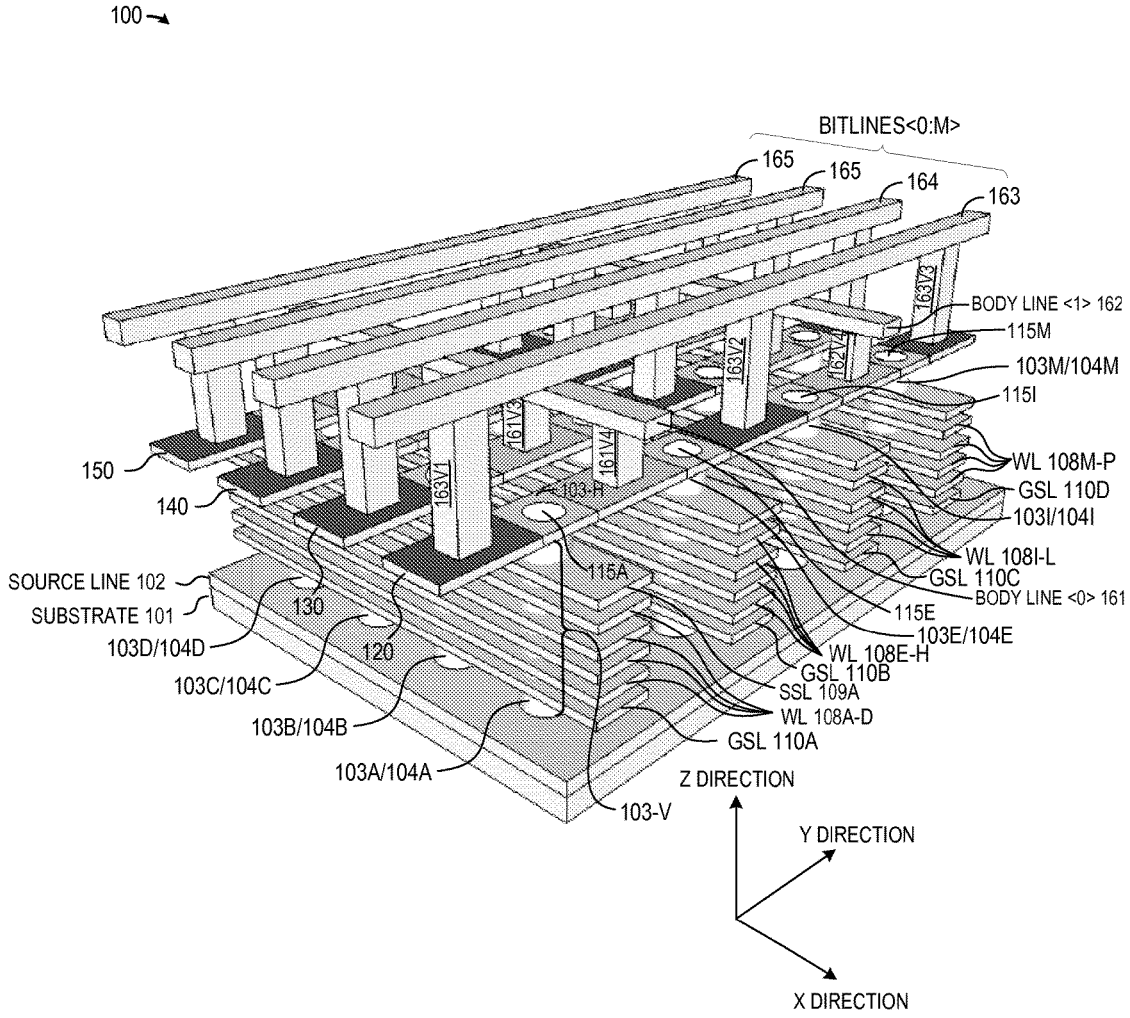
FIG. 6 illustrates a simplified perspective view of a three-dimensional vertical channel NAND flash memory array architecture using upper layer connection lines with n-type bit line nodes and p-type body nodes for stacks of vertical channel NAND flash cell strings.

FIG. 6 illustrates a simplified perspective view of a three-dimensional vertical channel NAND flash memory array architecture 100 having upper layer connection lines 120, 130, 140, 150 formed over a plurality of vertical channel NAND flash cell strings 103 with surrounding multilayered memory film structures 104 and stacked cell and select gate structures 108-110, where each upper layer connection line includes n-type bit line nodes and p-type body nodes for connection to the underlying flash cell strings 103. In the VC NAND flash memory 100, the plurality of NAND flash cell strings (e.g., 103A-D) are arranged in a matrix of rows (e.g., 103A/104A, 103B/104B, 103C/104C, 103D/104D) and columns (e.g., 103A/104A, 103E/104E, 103I/104I, 103M/104M). As formed, the NAND flash cell strings 103 extend vertically from a source diffusion layer 102 in a chip substrate 101 and through separate stacks of conductive layers (e.g., 108A-D, 109A, 110A) separated from one another by insulating layers (not shown) for direct connection to upper layer connection lines 120, 130, 140, 150. As described hereinbelow, each NAND string may be formed with a cell body layer (for example, a cylindrical polysilicon layer 103A) in which channels are formed to run in a vertical direction that is perpendicular to the chip surface, with different NAND strings (for example, cylindrical polysilicon layers 103B, 103C) being laterally separated from each other and arranged in a matrix shape when viewed from a top plan view. In addition, each cell string includes a bottom or vertical pillar portion 103-V and a top or horizontal cap portion 103-H. The bottom pillar portion 103-V is directly connected to the source diffusion layer 102 in the chip substrate 101, is shaped like a tube that wraps around a non-conductive dielectric core 115, and is surrounded by a multilayered memory film structure 104. The horizontal cap portion 103-H is directly connected to the bottom pillar portion 103-V and is formed as part of an upper layer connection line (e.g., 120) to make direct electrical connection to a bit line contact region and body line contact region formed therein.

In the illustrated example, the cell transistors formed along each silicon flash cell string (for example, 103A-D) are formed as gate-all-around devices by forming stacked word line gate structures 108A-D with multi-layered memory film structure 104A-D to surround the silicon flash cell string with cell transistor gates where each cell channel is formed. In addition, separate stacks of word line gate structures 108E-H, 108I-L, 108M-P may be formed around other groups of flash cell strings (e.g., 103E/104E, 103I/104I, 103M/104M). Though not separately shown, it will be appreciated that each multi-layered memory film structure 104 formed around each string 103 for each memory cell transistor may include a tunnel dielectric layer formed to surround the channel region of the silicon strip, a charge storage layer (for example, silicon nitride) formed around the tunnel dielectric layer, and a coupling dielectric formed around the charge storage layer. Around each multi-layered memory film structure (e.g., 104A-D), a stack of word line gate structures (e.g., 108A-D) may be formed with one or more patterned polysilicon layers to extend across multiple strings (e.g., 103A-D). While the transistors formed in each silicon string may include implanted and/or diffused source/drain regions (for example, n+ regions) for each defined transistor cell, in other embodiments, the transistors formed in at least the bottom or vertical pillar portion 103-V may be formed as junction-free cells with virtual source/drain regions formed to have conductivity that depends on the existence of electric fringe fields between gates adjacent to the source/drain regions and the source/drain silicon itself.

In addition to the stacked word line gate structures (e.g., 108A-D) defining multiple memory cells, each string may also include additional gate structures on each end of the string to define ground and string select line transistors. For example, ground select line transistors may be formed as a lower select gate at the bottom of each string with separate poly gate structures (e.g., 110A) which connect the source node of each vertical flash cell string (e.g., 103A-D) to a shared or common source line diffusion 102 formed in the substrate 101. In addition, string select transistors may be formed as an upper select gate at the top of each vertical flash cell string (e.g., 103A-D) with separate poly gate structures (e.g., 109A) which connect the drain nodes of each vertical flash cell string (e.g., 103A-D) to a corresponding drain region formed in the upper layer connection line (e.g., 120) which is electrically connected to a bit line (e.g., 163) of the cell array under control of a string select signal. In this way, the source nodes of all strings in a designated block are connected to the shared source line 102 in the substrate 101, but the drain nodes of each string (e.g., 103A) is shared only horizontally with other strings in a first lateral direction (e.g., 103E, 103I, 103M) via a shared bitline (e.g., 163), but not with strings in a second lateral direction. If desired, the ground and string select transistors may be formed as gate-all-around devices substantially as described above. For example, the string select transistor at the drain node of each string may be formed with a poly gate structure (for example, 109A-D) formed around a multi-layered memory film structure (e.g., 104A, 104E, 104I, 104M), while the ground select transistor at the source node of each string may be formed with a poly gate structure (e.g., 110A-D) formed around the corresponding multi-layered memory film structure.

As depicted in FIG. 6, the vertical channel NAND flash memory array 100 includes NAND flash strings 103 which run in the z-direction, where each string includes string select transistors formed with string select gates/lines 109, cell transistors formed with cell control gates 108, and ground select transistors formed with ground select gates 110. In each NAND flash string, the transistors are serially connected with the string select transistor located at the top, the cell transistors in the middle, and the ground select transistor at the bottom of the string. As described more fully hereinbelow, each string select transistor includes a drain region (shown in dark grey) formed in the upper layer connection line (e.g., 120) which is electrically connected to a bit line (e.g., 163) of the cell array, and a source which is connected to one of the multiple series-connected cell transistors in the associated NAND flash string. In addition, each ground select transistor has a source that is directly electrically connected to the source line region 102, and a drain which is connected to one of the multiple series-connected cell transistors in the associated NAND flash string. String select transistors, cell transistors and ground select transistors have gates connected to string select lines 109, word lines 108, and ground select lines 110, respectively, each running in the x-direction.

Each NAND flash string is formed with a semiconductor body 103 which is shared by the string select, cell, and ground select transistors belonging to that string 103. In selected embodiments, each NAND flash string has a shape which resembles a cylinder or vertical pillar so that the string body or channel runs along the long axes of the cylinders in the z-direction. As shown more clearly in FIG. 12, each transistor may include a semiconductor body 103 having a near-circular or elliptical cross section so that each gate electrode forms a gate-all-around type gate structure. In selected embodiments, such strings can be fabricated within vertical, cylinder-shaped memory "holes" cutting through stacked alternating layers of conductive gate material 108-110 and interlayer dielectrics by sequentially forming layers inside the "memory hole," including a gate dielectric or multi-layered memory film structure 104, semiconducting string body thin film 102 (e.g., polysilicon), and dielectric filler material 115 (e.g., silicon oxide). In selected embodiments, the memory film structure 104 may be formed with an outermost blocking (or coupling) dielectric, an inner charge storage layer, and an innermost tunnel dielectric. In addition, the string select transistors and ground select transistors may have the same basic structure as the cell transistors, though a gate dielectric layer may replace the memory film structure 104 in the case of the string select transistor and/or ground select transistor since these transistors do not store any data.

When a transistor is turned on, a conductive channel of a first conductivity type (for example n-type) is formed in the transistor body 103. When all transistors of a string are turned on during a read or program operation, a continuous conductive channel of the first conductivity type forms throughout the entire string 103 from the string drain to the string source, thereby forming a conductive path from a bit line to a source line node. During an erase operation, the string body 103 is charged with a high positive voltage (e.g., 18V-20V), thereby inducing a second, opposite conductivity type (for example p-type). To control the different read, program, and erase modes, each cell string has four different terminals to which external voltages can be applied: a drain terminal (bit line node) in the upper layer connection line, a source terminal (source line node) in the substrate, a body terminal (body line) in the upper layer connection line, and multiple gate terminals 108-110 which are the gate terminals of string select transistors, cell transistors and ground select transistors.

By forming each word line gate structure (e.g., 108A) to extend horizontally across separate multi-layered memory film structures (e.g., 104A-D) surrounding the vertical channel NAND flash cell strings (e.g., 103A-D), separate word line (WLi) signals may be connected across the word line gate structure 108A to cell transistors in the adjacent flash cell strings in a first horizontal or lateral direction that share the poly gate node 108A. Bit lines can also be shared by one or more adjacent flash cell strings formed in a second horizontal or lateral direction (for example, 103E, 103I, 103M) by connecting the strings through bit line contact regions in the upper layer connection line (e.g., 120) to a shared bit line (for example, 163) which is used to establish electrical connection from the connected strings to the common bit line through one or more via contacts or conductors 163V1-3. As illustrated, each of the bit line conductors 163-165 is connected to bit line contact regions in a corresponding upper layer connection line 120, 130, 140, 150) through via contacts or conductors. By the same token, separate body charging voltages may be connected to adjacent flash cell strings in a first horizontal or lateral direction that share a body line conductor (e.g., 161) by connecting the strings through body contact regions in the upper layer connection lines (e.g., 120, 130, 140, 150) to the shared body line (for example, 161) through one or more via contacts or conductors (e.g., 161V3-4) which apply a voltage for holding the body nodes of the connected strings at a predetermined or low voltage.

The depicted vertical channel NAND flash memory 100 illustrates selected example embodiments of a three-dimensional vertical channel NAND flash memory array which allows individual pages to be selected for read and program operation and which may erase selected blocks in a VG NAND structure using the upper layer connection lines 120, 130, 140, 150 to connect bit line and erase voltages to the flash cell strings. However, it will be appreciated that a vertical channel NAND flash memory may be implemented with different features and structures. For example, the cell string structures are described has having a dielectric filler at the core of the vertical pillar structures, but such structures are not functionally required in all embodiments. In addition, the different semiconductor structures, such as the flash strings or transistor gates, may be formed with polysilicon or with any desired semiconductor material. There are also numerous variations in the charge storage structures used to store charge in NAND flash devices, such as, for example, floating gate devices, charge-trap devices, etc. And while the string bodies may be formed with implanted p-type semiconductor material, selected embodiments may form the string bodies with undoped or even lightly n-type doped semiconductor material, such as silicon. Even in these cases, the conductivity type may be controlled during read/program or erase operation by way of external biasing conditions. It will also be appreciated that the vertical channel NAND flash memory 100 shown in FIG. 6 shows conductive elements, such as interconnections, contacts, string bodies and gate material, to highlight the connectivity of the constituting elements, but not isolating materials such as gate dielectrics, interlayer dielectrics, intermetal dielectrics, etc. Persons skilled in the art will understand that dielectric layers are located around the conductor elements to provide electrical isolation.

Figure 7:
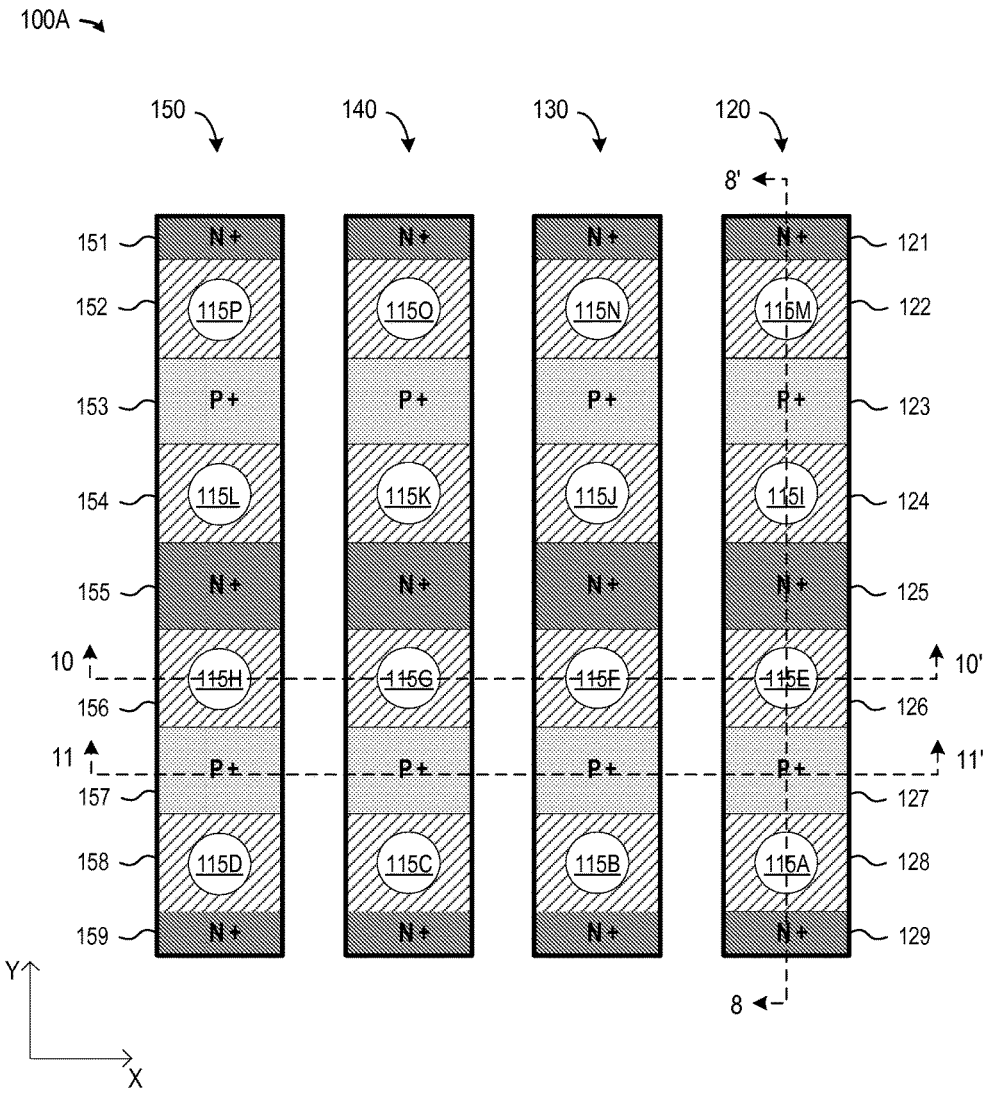
FIG. 7 illustrates a plan view of upper layer connection lines in the vertical channel NAND flash memory structure shown in FIG. 6 in accordance with selected embodiments of the present disclosure.

Turning now to FIGS. 7-14, there are provided various plan and cross-sectional views of the cell structures in the vertical channel NAND flash memory array 100 shown in FIG. 6 which reference x, y, and z axis directions. In these figures, a direction along an x-axis refers to a direction parallel to the word lines 108, a direction along a y-axis refers to a direction parallel to bit lines 163-165, and a direction along a z-axis refers to a direction perpendicular to the surface of the chip substrate 101. For example, FIG. 7 illustrates a plan view 100A of a plurality of upper layer connection lines 120, 130, 140, 150 shown in FIG. 6 in accordance with selected embodiments of the present disclosure. For ease of illustration, the contact vias and metal lines which connect to these regions are not shown. The illustrated top view 100A of the stacked cell array structure shows that each upper layer connection line includes a plurality of semiconductor regions having different conductivity types. For example, a first upper layer connection line 120 includes drain regions 121, 125, 129 of a first conductivity type (e.g., N+) and body line regions 123, 127 of a second, opposite conductivity type (e.g., P+) which are alternately disposed on each side of undoped or lightly doped string body regions 122, 124, 126, 128. In similar fashion, the other upper layer connection lines 130, 140, 150 likewise include first conductivity type drain regions (e.g., 151, 155, 159) and second conductivity type body line regions (e.g., 153, 157) alternately disposed on each side of string body regions (e.g., 152, 154, 156, 158).

In selected embodiments, the upper layer connection lines 120, 130, 140, 150 may be formed with different polysilicon film regions (e.g., 121-129) which each include lightly doped (or undoped) string body cap regions (shown in cross-hatch), string drain regions (shown in dark grey), and body line contact regions (shown in light gray). The string body cap regions (e.g., 122, 124, 126, 128, 152, 154, 156, 158) are positioned and aligned for connection to underlying vertical flash cell strings (e.g., 103M, 103I, 103E, 103A, 103P, 103L, 103H, 103D), and may be formed with a lightly doped or undoped semiconductor material (e.g., polysilicon) that is not permanently n-type or p-type conductive or permanently insulating, and may include either n-type or p-type sub-regions depending on externally applied voltage conditions. For example, the string body cap regions (e.g., 122, 124, 126, 128, 152, 154, 156, 158) may be lightly doped with p-type dopants and may therefore be of p-type conductivity at times when transistors are in a turned-off state. In similar fashion, the string drain regions (e.g., 121, 125, 129, 151, 155, 159) may be formed with polysilicon film regions having permanent n-type conductivity to form string drains for underlying vertical flash cell strings connected thereto (e.g., 103M, 103I, 103E, 103A, 103P, 103L, 103H, 103D). In addition, the body line contact regions (e.g., 123, 127, 153, 157) to form body line contact regions for underlying vertical flash cell strings connected thereto (e.g., 103M, 103I, 103E, 103A, 103P, 103L, 103H, 103D). The conductivity type and concentrations for the string body cap regions, string drain regions, and body line contact regions may be controlled by using patterning mask and implantation techniques to selectively implant ions of the desired conductivity type and amount into the target regions.

Figure 8:
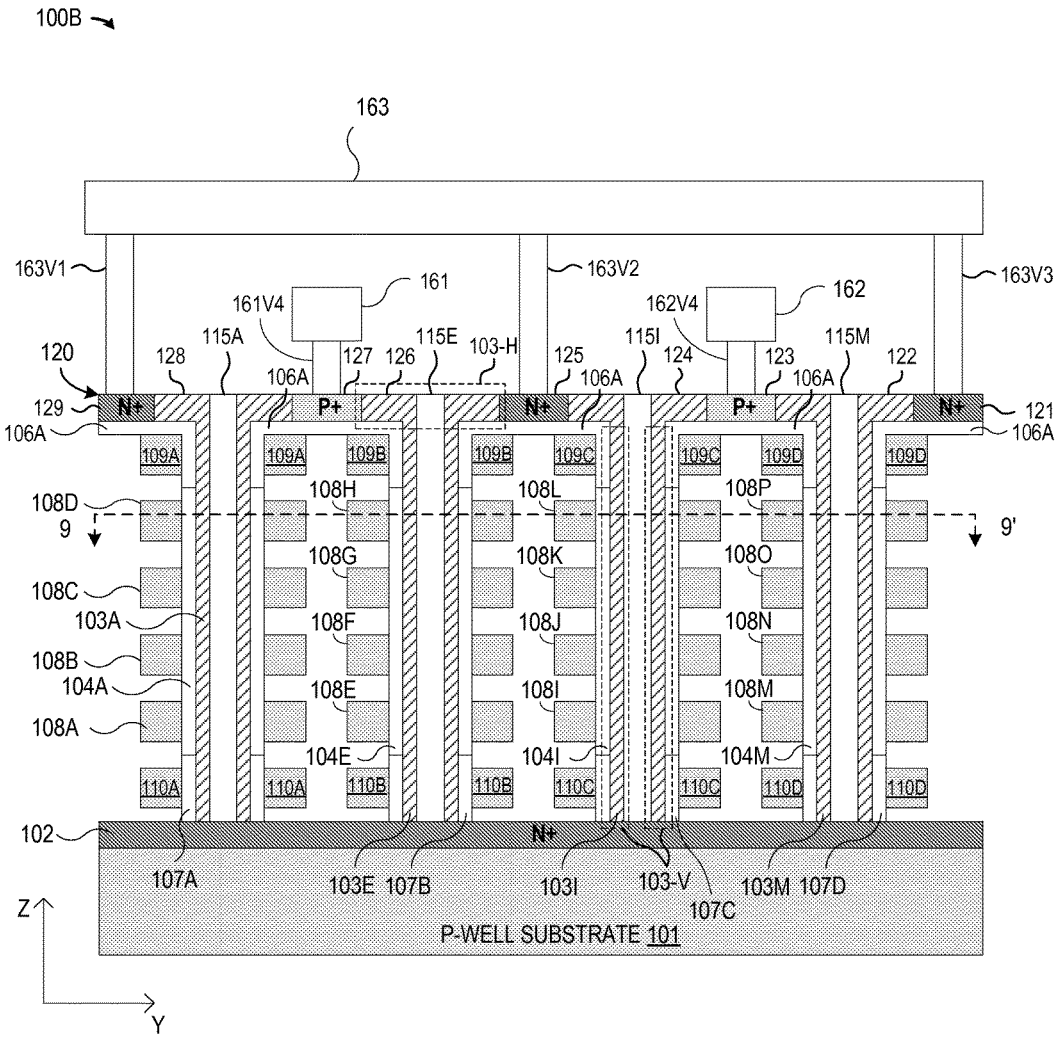
FIG. 8 illustrates a partial cross-sectional view of the vertical channel NAND flash memory structure shown in FIG. 6 cut in a bit line direction through an upper layer connection line.

To illustrate additional structural details of the vertical channel NAND flash memory shown in FIG. 6, reference is now made to FIG. 8, which illustrates a vertical cross-sectional view 100B taken in a bit line direction through an upper layer connection line 120 indicated with the 8-8' view line shown in FIG. 7. As illustrated, a row of NAND flash strings 103A, 103E, 103I, 103M and surrounding multi-layered memory film structures 104A, 104E, 104I, 104M extend from the substrate source line 102, through the stacked cell and select gate structures 108-110, and to the upper layer connection line 120. In particular, a first NAND flash string 103A is surrounded by a gate dielectric layer 107A, memory film structure 104A, and upper gate dielectric layer 106A and extends through stacked gate structures 110A, 108A, 108B, 108C, 108D, and 109A. Likewise, NAND flash strings 103E, 103I, 103M and surrounding gate dielectric layers 106A, memory film structures 104E, 104I, 104M, and upper gate dielectric layer 106A extend through stacked gate structures 110B/108E-H/109B, 110C/108I-L/

109C, and 110D/108M-P/109D. Each NAND flash string includes a first vertical portion 103-V and a second horizontal portion 103-H.

The first vertical portion of each string 103A, 103E, 103I, 103M may be shaped as a hollow (or optionally filled) cylindrical semiconductor tube surrounding a dielectric fill layer 115A, 115E, 115I, 115M, that is directly electrically connected to the n-type source line region 102 formed in the substrate 101. Each vertical string portion runs between the string source line 102 and the uppermost vertical portion adjacent to the string select transistor gates 109A, 109B, 109C, 109D. The uppermost part of the first vertical portion 103-V is therefore controlled by the sidewall-facing portion of the corresponding string select transistor 109A, 109B, 109C, 109D.

The second horizontal portion 103-V of each string 103A, 103E, 103I, 103M is formed with the string body regions 122, 124, 126, 128 in the upper layer connection line 120 to be located above the string stack and facing the upper side of the corresponding string select transistor 109A, 109B, 109C, 109D. The second horizontal portion faces the corresponding string select transistor gate 109A, 109B, 109C, 109D across the gate dielectric 106A, and is therefore controlled by the upward-facing portion of the string select transistor 109A, 109B, 109C, 109D in the same way the vertical portions of the string select transistor channels are controlled. Formed as part of the upper layer connection line 120, the second horizontal portion 103-V of each string 103A, 103E, 103I, 103M is directly connected to a corresponding drain region 121, 125, 129 (shown in dark grey) having a permanent first conductivity type (e.g., N+) to function as a string drain region. In read and program operations for the strings 103A, 103E, 103I, 103M, each drain region 121, 125, 129 is connected to a shared bit line 163 through one or more interconnect or via structures 163V1-3. The second horizontal portion 103-V of each string 103A, 103E, 103I, 103M is also directly electrically connected to a corresponding body line region 123, 127 of a second, opposite conductivity type (e.g., P+) (shown in light grey). During erase operations for the strings 103A, 103E, 103I, 103M, each body line region 123, 127 is connected to a corresponding body line 161, 162 through one or more corresponding interconnect or via structures 161V4, 162V4.

Figure 9:
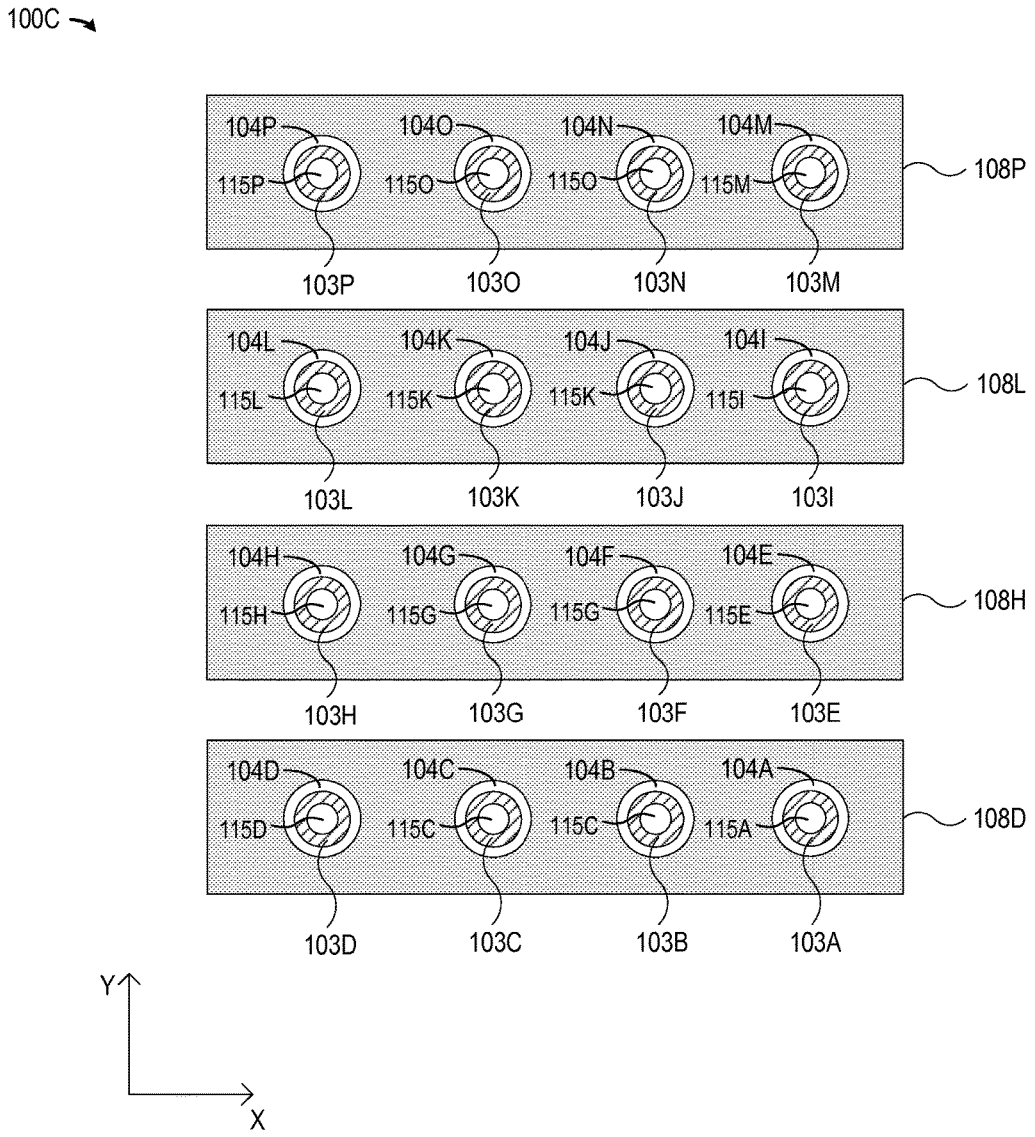
FIG. 9 illustrates a plan view of transistor gate lines in a single lateral plane to show additional structural details of the flash cell strings in the vertical channel NAND flash memory structure shown in FIG. 6.

To illustrate additional structural details of the vertical channel NAND flash memory shown in FIG. 6, reference is now made to FIG. 9, which illustrates a lateral cross-sectional view 100C taken in the x-y plane through a plurality of transistor gate word lines 108D, 108H, 108L, 108P indicated with the 9-9' view line shown in FIG. 8. As illustrated, each word line may be formed with a patterned layer of conductive material, such as doped polysilicon, which is shared by a plurality of NAND flash strings aligned in the x-axis direction. In particular, a first transistor gate word line 108D extends horizontally across a row of NAND flash strings 103A-D, each of which is formed around a corresponding dielectric core 115A-D and surrounded by a corresponding multi-layered memory film structure 104A-D, thereby forming a gate-all-around type gate electrode 108D. In the same layer, a second, separate transistor gate word line 108H extends horizontally across another row of NAND flash string structures 103E-H/115E-H/104E-H. In addition, a third transistor gate word line 108L extends horizontally across another row of NAND flash string structures 103I-L/115I-L/104I-L, and a fourth transistor gate word line 108P extends horizontally across another row of NAND flash string structures 103M-P/115M-P/104M-P. As will be appreciated, the same layout and arrangement of transistor gate word lines shown in FIG. 9 could be used for other levels in the stacked array, including other transistor gate word lines, ground select transistor lines, and/or string select transistor lines.

Figure 10:
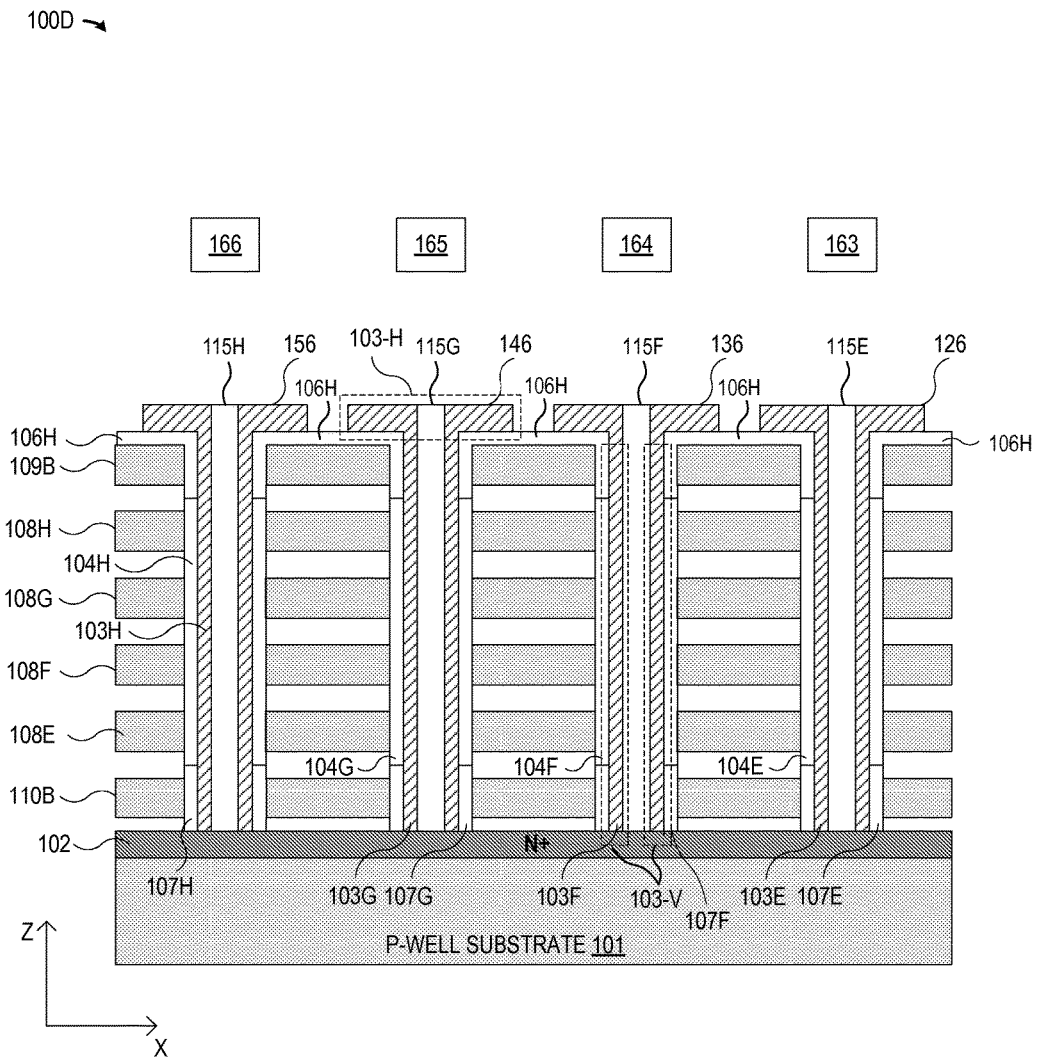
FIG. 10 illustrates a partial cross-sectional view of the vertical channel NAND flash memory structure shown in FIG. 6 cut in a word line direction through a row of flash cell strings.

To illustrate additional structural details of the vertical channel NAND flash memory shown in FIG. 6, reference is now made to FIG. 10, which illustrates a vertical cross-sectional view 100D taken in a word line direction through a row of NAND flash strings 103E-H indicated with the 10-10' view line shown in FIG. 7. As illustrated, a row of NAND flash strings 103E-H and surrounding multi-layered memory film structures 104E-H aligned in the x-axis direction extend from the substrate source line 102, through the stacked cell and select gate structures 110B, 108E-H, 109B, and to the string body regions 126, 136, 146, 156 in the upper layer connection lines 120, 130, 140, 150. In particular, a first NAND flash string 103E is surrounded by a gate dielectric layer 107E, memory film structure 104E, and upper gate dielectric layer 106H, and extends through stacked gate structures 110B, 108E-H, 109B. Likewise, NAND flash strings 103F, 103G, 103H and surrounding gate dielectric layers 106H, memory film structures 104F, 104G, 104H, and upper gate dielectric layer 106H extend through stacked gate structures 110B, 108E-H, 109B. Again, each NAND flash string 103E-H includes a first vertical portion 103-V and a second horizontal portion 103-H formed with the string body regions 126, 136, 146, 156 from the upper layer connection lines 120, 130, 140, 150.

Figure 11:
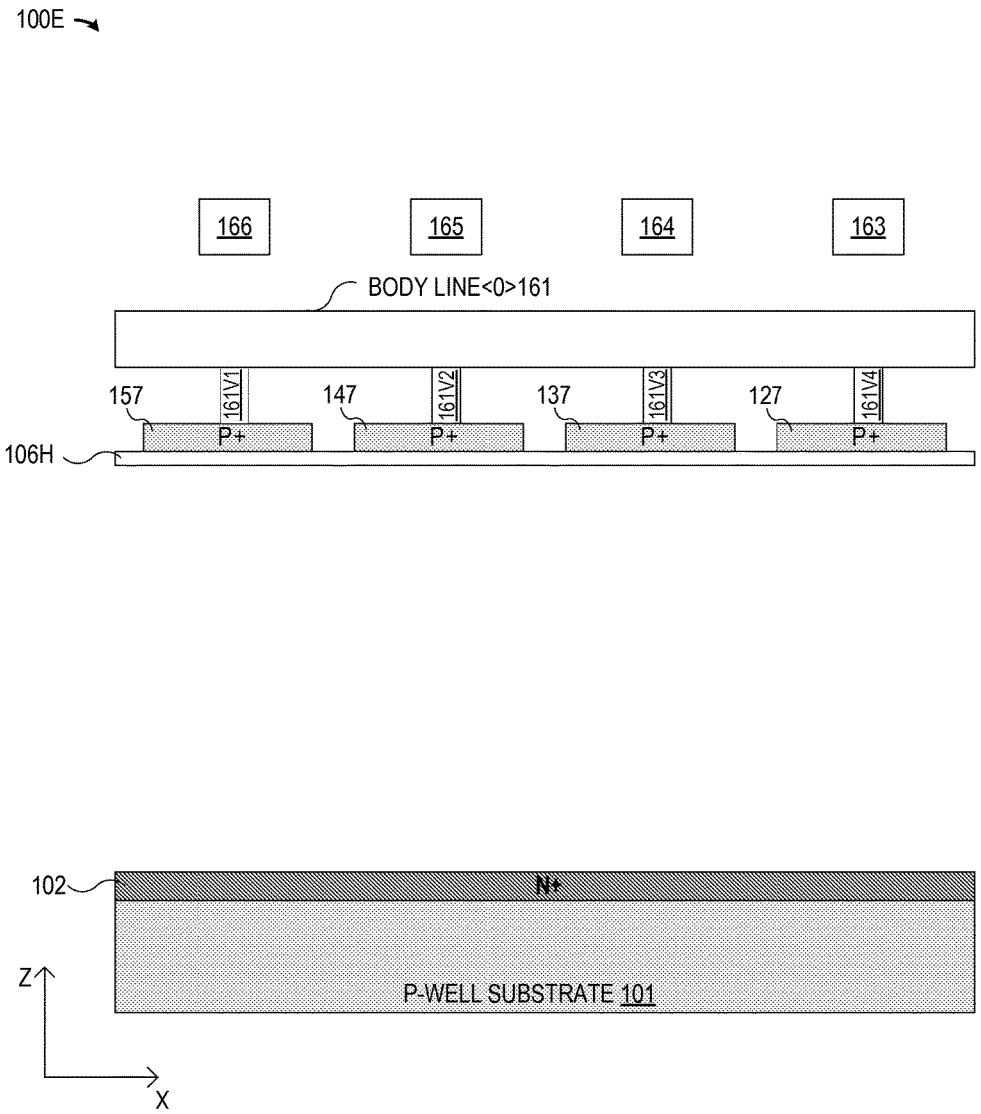
FIG. 11 illustrates a partial cross-sectional view of the vertical channel NAND flash memory structure shown in FIG. 6 cut in a word line direction between adjacent rows of flash cell strings.

To illustrate additional structural details of the vertical channel NAND flash memory shown in FIG. 6, reference is now made to FIG. 11, which illustrates a vertical cross-sectional view 100E taken in a word line direction indicated with the 11-11' view line shown in FIG. 7. As illustrated, body line regions 127, 137, 147, 157 from the upper layer connection lines 120, 130, 140, 150 are formed over the substrate 101 and source line region 102, and are connected across interconnect or via structures 161V1-3 to an associated body line (e.g., Body Line <0> 161) which runs orthogonally in the x-axis direction below the bit lines 163-166. The body line regions 127, 137, 147, 157 are aligned in the x-axis direction between the adjacent rows of NAND flash strings 103A-D, 103E-H (not shown), and are used to connect the adjacent strings to the associated body line (e.g., Body Line <0> 161). For example, the body line region 127 from upper layer connection line 120 is directly electrically connected to the string body regions 128, 126 for NAND flash strings 103A, 103E to function as an active body line during erase operations when an erase voltage from the body line 161 is applied through one or more interconnect or via structures 163V4. The same erase voltage from the body line 161 may be applied through one or more additional interconnect or via structures 161V1-3 to body line regions 137, 147, 157 in other upper layer connection lines 130, 140, 150, and in turn to the NAND flash strings 103B-D, 103F-H respectively connected thereto.

Figure 12:
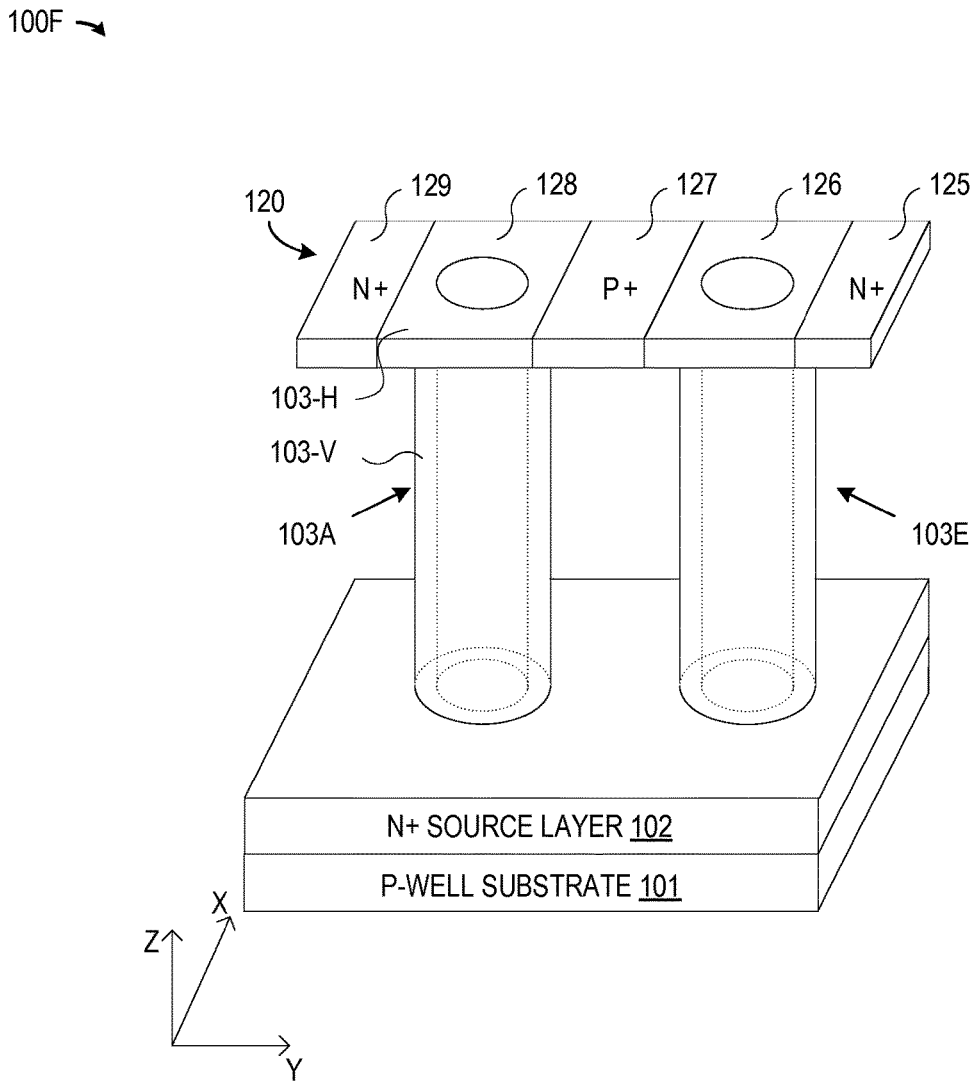
FIG. 12 illustrates a simplified perspective view of a portion of the vertical channel NAND flash memory structure shown in FIG. 6 to show the connection of the semiconductor string bodies between the substrate and upper layer connection line.

To give a clearer understanding of the three-dimensional shape of the portions of the device which consist of semiconducting material, reference is now made to FIG. 12, which shows a partial perspective view 100F of the semiconductor portions of the vertical channel NAND flash memory structure shown in FIG. 6 to show the connection of the semiconductor string bodies 103A, 103E between the substrate 101 and upper layer connection line 120. In particular, the upper layer connection line 120 includes n-type conductivity regions 125, 129 which are electrically connected to contact vias and metal bit lines (not shown). In addition, the upper layer connection line 120 includes p-type conductivity regions 127 that are electrically connected to contact vias and metal body lines (not shown) which are different from the bit lines. Finally, the upper layer connection line 120 includes undoped or lightly doped string body regions 126, 128 which are formed between the n-type conductivity regions 125, 129 and p-type conductivity regions 127 as a top or horizontal cap portion 103-H of each string. Extending down form the horizontal cap portions 126, 128, each string 103A, 103E includes a vertical cylinder shaped portion 103-V which is connected directly to the N+ source layer 102 in the substrate 101. Although the n-type regions, p-type regions, and lightly doped (or undoped) regions have been described as separate entities, it will be appreciated that they may be connected with each other in a continuous thin polysilicon film 125-129 which may be deposited in the same fabrication step, and then doped with different doping type ions to delineate separate regions of different conductivity types. For example, selected example embodiments of each upper layer connection line may include horizontal portions that are laterally patterned along semiconductor strips formed over the stacked array to have a long axis along the bit line direction (y-axis) and a short axis along the word line direction (x-axis) so as to be electrically isolated from each other. In this way, the n-type conductivity drain regions 125, 129 formed in the upper layer connection line 120 are isolated from adjacent n-type drain regions (e.g., 139, 135) in the x-direction. However, multiple n-type drain regions belonging to the same strip 120 are connected to the same bit line (not shown), while the n-type drain regions belonging to different strips (in other words have different x-coordinates) are connected to different bit lines. Therefore, strings share bit lines in the y-direction as in most known NAND Flash devices, but not in the x-direction.

In operation, selected embodiments of the vertical channel NAND flash memory array 100 described herein are operative to perform basic read, program, and erase operations using the cell structures disclosed herein. Examples of such operations will now be provided with reference to FIGS. 13 and 14 which illustrate selected examples of device operation. However, the following description is not intended to be an exhaustive description of the device operation including all possible scenarios, but is instead provided to illustrate example read/program and erase operations to illustrate ways in which electrical paths are formed in the VC NAND flash memory array 100.

Figure 13:
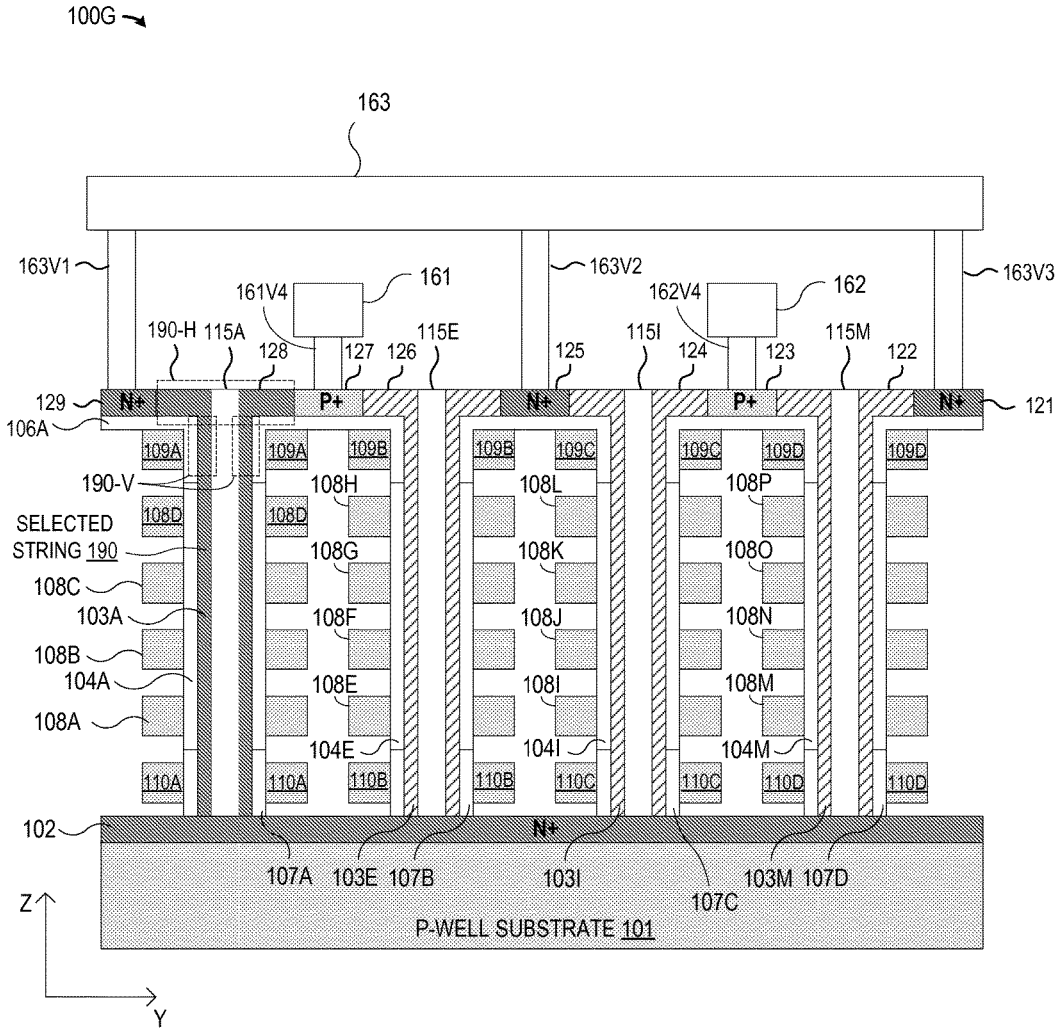
FIG. 13 illustrates a partial cross-sectional view of the vertical channel NAND flash memory structure shown in FIG. 8 during selection of a flash cell string for a read operation.

Turning now to FIG. 13, there is shown a partial cross-sectional view 100G of the vertical channel NAND flash memory shown in FIG. 8 during selection of a flash cell string for a read operation. As illustrated, the leftmost string 103A is selected as the string 190 from which data will be read by applying appropriate voltages to the string terminals. In particular, a positive read voltage (e.g., Vcc=1.8V) is applied to the bit line 163, and a positive read pass voltage (e.g., 4.5V) is applied to the gates of all string select, memory cell, and ground select transistors on the selected string 190, except for the one cell transistor which is intended to be read. In addition, a read voltage (e.g., 0V) is applied to the word line gate for the cell transistor to be read, and a holding voltage (e.g., 0V) is applied to body line 161 for the selected string 190 to hold the body node 103A of the string at a low voltage. Since the uppermost select transistor of the selected string 190 (a.k.a., string select transistor) is turned ON by application of the read pass voltage to gate conductor 190A, its channel is in an n-type conductive state. As described hereinabove, the channel of the uppermost string select transistor includes a vertical conducting portion 190-V and a horizontal conducting portion 190-H since the conductive n-type inversion layer is induced by the gate conductor 190A in both the horizontal and vertical portions of the string body 103A. The horizontal portion of the induced n-type channel 190-H is electrically connected to a drain region 129 of permanent n-type impurity, and thus also to the bit line 163 across the interconnect/via structure(s) 163V1. As a result, all transistors in the selected string 190 are turned ON to establish a continuous conducting channel throughout the selected string 190 from the bit line 163 to the source line 102. This conduction state is indicated by the darker grey color of the selected string 190. In other read scenarios, it will be appreciated that the conductive n-type string channel may extend only partway down the string 103 from the string drain/bit line node 129 to the cell intended to be read. Thus, the illustrated example serves only to show that the conductive string channel connects through the vertical and horizontal portions of the string select transistor to the permanent n-type drain region 129 in the upper layer connection line 120. In similar fashion, program operations for a selected string (e.g., 190) may form a conductive string channel from the n-type drain region 129 in the upper layer connection line 120 through the horizontal and vertical channel portions of the string select transistor in the same manner as during read operation.

Figure 14:
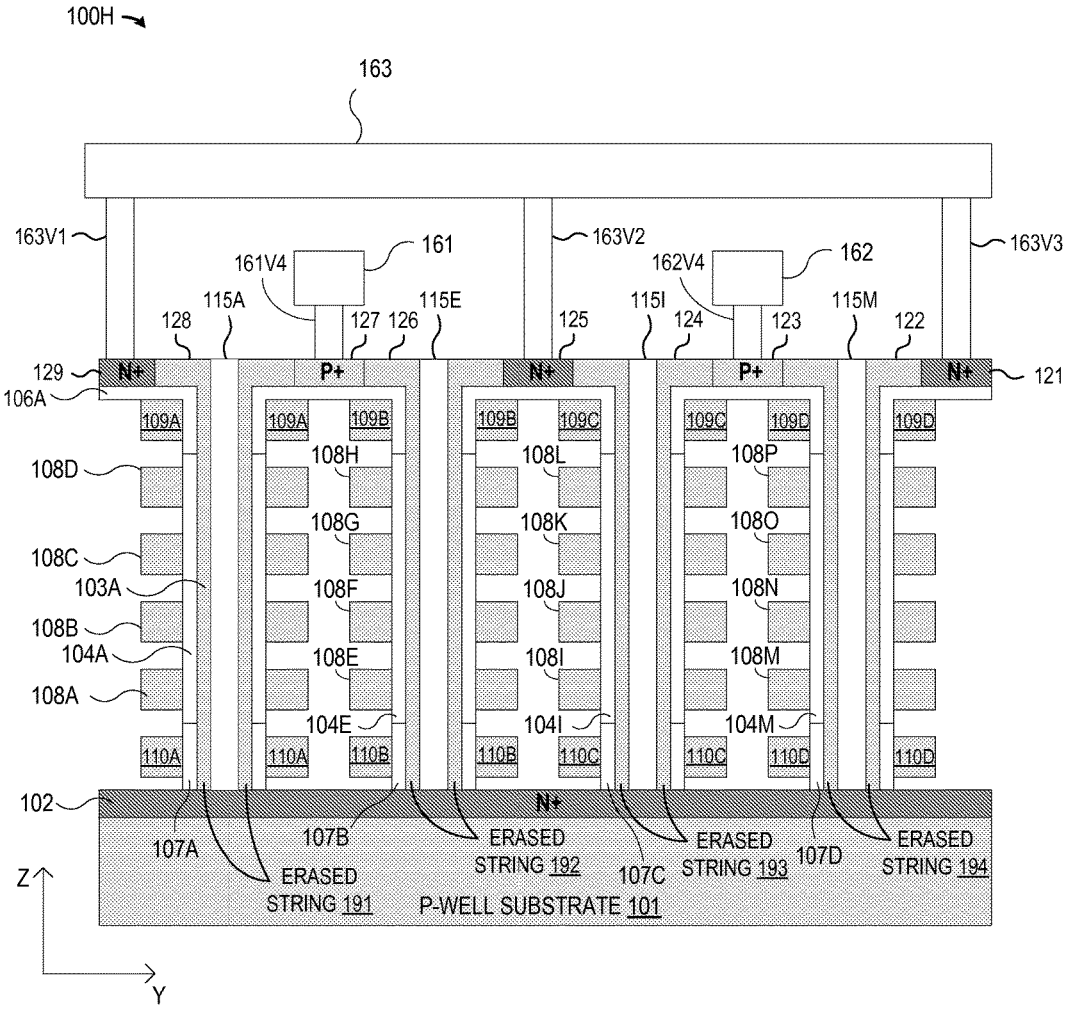
FIG. 14 illustrates a partial cross-sectional view of the vertical channel NAND flash memory structure shown in FIG. 8 during erasure of a block of flash cell strings.

Turning now to FIG. 14, there is shown a partial cross-sectional view 100H of the vertical channel NAND flash memory shown in FIG. 8 during erasure of a block of flash cell strings 191-194. As illustrated, the strings are erased by applying external biasing voltages to the string terminals. In particular, the bodies of all strings 191-194 may be charged with a high positive erase voltage V_erase (e.g., 18-20 V) that is applied from the body line conductors 161, 162 and associated interconnect/via structures 161V4, 162V4 and through the body line contact regions 127, 123 in the upper layer connection line 120. In addition, the word lines of cell blocks intended to be erased may be held at a low voltage (e.g., 0V) while the bit lines (e.g., 163) and source lines (e.g., 102) may be left floating, but may nonetheless passively charge up through forward biased p-n junctions at the boundaries between string source/drains and string bodies up to a certain voltage (e.g., V_erase reduced by the built-in junction potential). By applying the erase voltage V_erase to the string bodies 191-194 using body lines 161, 162 which are connected to the permanently p-type conductive regions 127, 123 of the upper layer connection line 120, the p-type conductive string bodies during erase operation are in direct contact with the permanently p-type conductive regions 127, 123, thereby forming a single node with the string bodies without any n-p junction in between. As a result, the application of the erase voltage V_erase to the body lines 161, 162 charges the string bodies 191-194 with the erase voltage V_erase at the same time.

While any desired fabrication sequence may be used to form the vertical channel NAND flash memory structures disclosed herein, the manufacturing process may include an initial step of forming a NAND flash memory cell array in which transistors are vertically stacked on NAND flash strings arranged in a matrix pattern to extend up from a substrate. For example, alternating layers of polysilicon and dielectric insulator layers may be deposited, patterned, and selectively etched to define a laminated stack of patterned gate conductor layers over a substrate. In the laminated stack, a matrix pattern of memory holes may be selectively etched down to the substrate, and then sequentially filled with memory film structure layers and semiconductor body layers to thereby form the vertical channel NAND flash strings. Over the VC NAND flash strings, a plurality of body connection layer strips may then be formed with alternating n-type drain and p-type body contact regions surrounding undoped or lightly doped string body regions which are positioned and connected to underlying vertical string structures. Subsequently, additional interconnect structures are formed to connect bit line conductors to the n-type drain contact regions, and to connect body line conductors to the p-type body contact regions.

Figure 15:
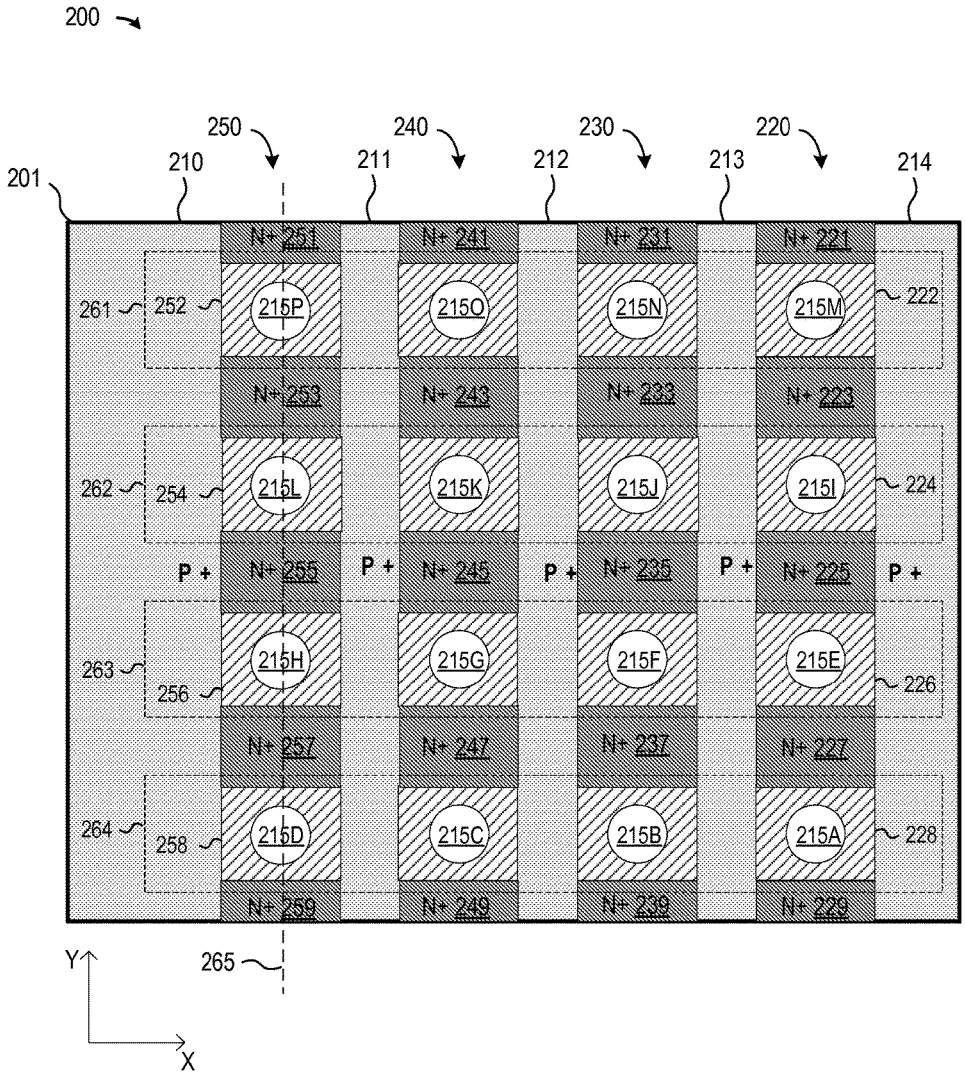
FIG. 15 illustrates a plan view of an upper body connection layer in a vertical channel NAND flash memory structure in accordance with selected embodiments of the present disclosure wherein n-type and p-type regions in the upper body connection layer separate the horizontal semiconductor body portions of the flash cell strings.

As will be appreciated, the patterning and positioning of the drain and body contact regions in the upper body connection layers may be arranged in any way which prevents two adjacent strings having different x-coordinates from being connected to the same bit line. As described hereinabove with reference to FIG. 7, this may be accomplished by patterning the horizontal portions of isolated polysilicon film strips to have a long axis along the y-axis so as to isolate n-type regions associated to different strings from each other. However, this is not the only way to isolate bit-line nodes (n-type regions), and there are a variety of different ways to form upper body connection layers which provide the required bit line node isolation. For example, reference is now made to FIG. 15 which shows a plan view 200 of an upper body connection layer 201 in a vertical channel NAND flash memory in accordance with selected embodiments of the present disclosure wherein n-type and p-type regions are formed in strips 220, 230, 240, 250 of the upper body connection layer 201 to separate and surround horizontal semiconductor body regions (e.g., 222, 224, 226, 228) of the flash cell strings. As shown in the plan view 200, horizontal strips of body connection layers 220, 230, 240, 250 are formed in a continuous polysilicon film layer 201 instead of being patterned into isolated strips. In each of the body connection layer strips (e.g., 220), n-type conductive drain regions 221, 223, 225, 227, 229 are electrically isolated from n-type conductive drain regions 231, 233, 235, 237, 239 in body connection layer strips (e.g., 230) that are adjacent in the x-axis direction by p-type conductive regions (e.g., 213, 214 which extend in the y-axis direction (e.g., 213) formed therebetween. In similar fashion, other body connection layer strips (e.g., 240) have n-type conductive drain regions 241, 243, 245, 247, 249 which are surrounded on each side in the x-axis direction by p-type conductive regions 211, 212 extending in the y-axis direction, thereby providing electrical isolation from adjacent n-type conductive drain regions 251, 253, 255, 257, 259, 231, 233, 235, 237, 239 in adjacent body connection layer strips (e.g., 250, 230). In this arrangement, n-type drain regions 253, 255, 257 belonging to the same strip 250 may be connected to the same bit line, as indicated with dashed line 265. However, n-type drain regions 243, 245, 247 in adjacent connection layer strips (e.g., 240) are connected to different bit lines so that strings share bit lines in the y-direction but not in the x-direction. By the same token, portions of the p-type conductive regions 210-214 located between n-type conductive drain regions may be used as body line contact regions for the string cells, as indicated by the dashed body lines 261-264.

Selected embodiments of the vertical channel NAND flash memory disclosed herein may be used to provide a VC NAND cell structure which facilitates application of external voltages to access cell nodes (such as string gates, drains, sources and bodies) to improve performance. For example, by forming the upper body connection layers with different lateral locations for string drains and string bodies, these locations are exposed in such a way that they can easily by connected to contact vias and metal interconnection lines. In addition, the upper body connection layers facilitate the direct biasing of string body nodes so that the string body nodes are not floating and can be directly biased from an external connection during erase operation. Another benefit of providing string body node connections through the upper body connection layer is that the substrate source line diffusion layer is not restricted to be formed or patterned into any particular shape. In addition, the substrate source line diffusion layer need not be patterned into long, thin high-resistance lines as is the case in conventional schemes where the body connection is located under the cell stack. Yet another benefit from selected embodiments is that the n-type and p-type regions in the upper body connection layer may be laterally positioned and displaced away from the underlying vertical cell string portions and connected to the horizontal string portions to reduce or eliminate the risk of dopant diffusion into the vertical string portions which can adversely affect the transistor characteristics of the string select transistors or the cell transistors. The formation of the n-type and p-type regions in the upper body connection layer also allows these regions to be implanted after the cell stacking process so that any high temperature fabrication processes that occur during the cell stacking process do not cause any unwanted n-type/p-type dopant diffusion.

By now it should be appreciated that there is provided herein a three-dimensional integrated circuit non-volatile memory device with upper connection line for providing bit line and body line voltages. The disclosed NVM device includes a NAND flash memory array formed over a substrate having a source line region of a first conductivity type (e.g., a heavily doped N+ source line region) formed at a surface of the substrate. The NAND flash memory array includes a plurality of NAND flash strings, each having a vertical channel string body connected between the source line region and an upper semiconductor layer which extends parallel to the surface of the substrate. In selected embodiments, the NAND flash memory array includes multiple upper semiconductor layer strips running in a bit line direction which are electrically isolated from one another in a word line direction, each upper semiconductor layer strip electrically connecting a shared bit line through one or more drain regions in said upper semiconductor layer strip to NAND flash strings from different word lines. In such cases, the upper semiconductor layer strips electrically connect a shared body line through body line contact regions in said upper semiconductor layer strips to NAND flash strings sharing one or more common word lines. In other embodiments, the upper semiconductor layer is formed with alternating first and second connection strips running in the bit line direction and formed in a continuous semiconductor layer. Formed over a column of NAND flash strings, each first connection strip includes a horizontal string body region connected to each underlying NAND flash string, and a drain region connected to each horizontal string body region for electrically connecting a bit line through said drain region and horizontal string body region to said underlying NAND flash string. Each second connection strip is formed adjacent to a corresponding first connection strip and includes a body line contact region connected to each horizontal string body region in the corresponding first connection strip for electrically connecting a body line through said body line contact region and each connected horizontal string body region to said underlying NAND flash string. In such cases, the upper semiconductor layer may include a plurality of first connection strips formed over a corresponding plurality of NAND flash string columns, and a plurality of second connection strips formed between the plurality of first connection strips for electrically connecting one or more shared body line conductors through body line contact regions formed in each second connection strip to the plurality of NAND flash strings. Each NAND flash string includes a plurality of series-connected transistors formed along a corresponding vertical channel string body between the source line region and the upper semiconductor layer which includes a horizontal string body region connected to each vertical channel string body, a drain region of the first conductivity type connected to each horizontal string body region, and a body line contact region of a second, opposite conductivity type connected to each horizontal string body region. For example, the drain region may be an n+ doped region formed in the upper semiconductor layer to be laterally offset from the vertical channel string body, and the body line contact region may be a p+ doped region formed in the upper semiconductor layer to be laterally offset from the vertical channel string body. The series-connected transistors may include an upper select gate transistor, a lower select gate transistor, and a plurality of memory cell transistors formed between the upper and lower select gate transistors. The upper select gate transistor may be a string select transistor formed adjacent to a corresponding horizontal string body region that is connected to the vertical channel string body, thereby defining horizontal and vertical string body portions for the NAND flash string. In this way, the upper select gate transistor has a first channel portion that runs parallel to the surface of the substrate and a second channel portion that runs perpendicular to the surface of the substrate. In addition, the upper select gate transistor may include a gate electrode that is located between the first channel portion of the upper select gate transistor and the surface of the substrate.

In another form, there is provided a NAND Flash memory cell array that is formed on a substrate with a plurality of semiconductor string bodies running in a direction perpendicular to a surface of the substrate. As formed, each semiconductor string body is connected between an n-type source region formed in the substrate and an upper semiconductor layer formed over the substrate, where each upper semiconductor layer comprises a horizontal string body region connected to and formed over an associated semiconductor string body, an n-type conductivity region connected through each horizontal string body region to the associated semiconductor string body, and a p-type conductivity region connected through each horizontal string body region to the associated semiconductor string body, where the n-type conductivity region and p-type conductivity region are each laterally offset from the associated semiconductor string body. In addition, an upper select gate may be formed at an upper end of each semiconductor string body, where each upper select gate controls a first channel portion formed in the horizontal string body region that runs parallel to the surface of the substrate and a second channel portion formed in the semiconductor string body that runs perpendicular to the surface of the substrate. In this way, the upper select gate may be located between the first channel portion and the surface of the substrate. Each upper select gate is positioned and connected upon application of a first voltage to induce n-type conductivity in the first and second channel portions to electrically connect the first channel portion to an associated n-type conductivity region in the upper semiconductor layer. Each upper select gate may also be positioned and connected upon application of a second voltage to induce p-type conductivity in the first and second channel portions to electrically connect the first channel portion to an associated p-type conductivity region in the upper semiconductor layer. The n-type conductivity region in each upper semiconductor layer is electrically connected to a first conductive line, and the p-type conductivity connective region in each upper semiconductor layer is electrically connected to a second conductive line. With these connections, the first conductive line may function as a bit line for transferring data bits to or from one or more semiconductor string bodies, and the second conductive line may function as a body line for transferring a positive voltage to one or more semiconductor string bodies.

In yet another form, there is provided a method for reading an addressed memory cell transistor from a plurality of NAND flash strings, where each string includes a vertical channel string body in which a plurality of series-connected transistors are formed between a substrate source line region and an upper semiconductor layer. The series-connected transistors on each string may include an upper select gate transistor, a lower select gate transistor, and a plurality of memory cell transistors formed between the upper and lower select gate transistors. In the disclosed methodology, a bit line read voltage is applied to a bit line conductor which is connected through an n-type string drain region formed in the upper semiconductor layer to a selected flash string on which the addressed memory cell transistor is formed. In addition, a body voltage is applied to a body line conductor which is connected through a p-type string region formed in the upper semiconductor layer to the selected flash string on which the addressed memory cell transistor is formed. Finally, a read gate voltage is applied to the addressed memory cell transistor while otherwise applying a positive gate voltage to the other series-connected transistors formed on the selected flash string, thereby reading a value from the addressed memory cell transistor that is transferred through the n-type string drain region formed in the upper semiconductor layer and to the bit line conductor under control of the upper select gate transistor for the selected flash string. In selected embodiments, the application of the positive gate voltage to the other series-connected transistors includes applying the positive gate voltage to an upper select gate formed at an upper end of the selected flash string to control a first channel portion of a horizontal string body region formed in the upper semiconductor layer and a second channel portion of a vertical string body formed in the selected flash string.

In still yet another form, there is provided a method for erasing an erase block of NAND flash strings, where each string includes a vertical channel string body in which a plurality of series-connected transistors are formed between a substrate source line region and an upper semiconductor layer. The series-connected transistors may include an upper select gate transistor, a lower select gate transistor, and a plurality of memory cell transistors formed between the upper and lower select gate transistors. In the disclosed methodology, a large positive erase voltage is applied to a body line conductor which is connected through p-type string regions formed in the upper semiconductor layer to the erase block of NAND flash strings, thereby charging the vertical channel string bodies in the erase block of NAND flash strings. In addition, a smaller erase gate voltage is applied to the series-connected transistors formed on the erase block of NAND flash strings. Also, the substrate source line is floated along with one or more bit line conductors which are connected through an n-type string drain regions formed in the upper semiconductor layer to the erase block of NAND flash strings.

Although the described exemplary embodiments disclosed herein are directed to various non-volatile memory device structures and methods for making and operating same by forming body contact regions and string drain regions over a stacked NAND string array, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the NAND cell transistors are described as n-channel transistors on p-type (or undoped) substrate, this is merely for illustration purposes, and it will be appreciated that n and p-type impurities may be interchanged so as to form p-channel transistors on n-type substrate, or the substrate may consist of undoped silicon. In addition, the flash memory cells are illustrated herein as being embodied as vertical channel NAND memory cell strings, but this is merely for convenience of explanation and not intended to be limiting and persons of skill in the art will understand that the principles taught herein apply to other suitable kinds of cell structures and the resulting different bias conditions. It will also be appreciated that the disclosed cell array structure bias voltage scheme for read, program, and erase operations is not tied to any specific cell technology. For example, the figures illustrate examples in which there are sixteen vertical channel NAND strings which each have four memory cells and two select gate transistors; however, other embodiments are not restricted to any specific number of strings or transistors, and even work for single layer cell arrays. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," "includes," "including," "has," "having," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A non-volatile memory device, comprising:

a substrate comprising a source line region of a first conductivity type formed at a surface of the substrate; and a NAND flash memory array formed over the substrate comprising a plurality of NAND flash strings, each comprising a vertical channel string body connected between the source line region and an upper semiconductor layer which extends parallel to the surface of the substrate, where the upper semiconductor layer comprises:

a horizontal string body region connected to each vertical channel string body, a drain region of the first conductivity type connected to each horizontal string body region, and a body line contact region of a second, opposite conductivity type connected to each horizontal string body region.

2. The non-volatile memory device of claim 1, where the source line region comprises a heavily doped N+ source line region formed in the substrate.

3. The non-volatile memory device of claim 1, where each NAND flash string comprises a plurality of series-connected transistors formed along a corresponding vertical channel string body between the source line region and the upper semiconductor layer, comprising an upper select gate transistor, a lower select gate transistor, and a plurality of memory cell transistors formed between the upper and lower select gate transistors.

4. The non-volatile memory device of claim 3, where the upper select gate transistor has a first channel portion that runs parallel to the surface of the substrate and a second channel portion that runs perpendicular to the surface of the substrate.

5. The non-volatile memory device of claim 4, where the upper select gate transistor comprises a gate electrode that is located between the first channel portion of the upper select gate transistor and the surface of the substrate.

6. The non-volatile memory device of claim 3, where upper select gate transistor comprises a string select transistor formed adjacent to a corresponding horizontal string body region that is connected to the vertical channel string body, thereby defining horizontal and vertical string body portions for the NAND flash string.

7. The non-volatile memory device of claim 1, where the NAND flash memory array comprises a plurality of upper semiconductor layer strips running in a bit line direction which are electrically isolated from one another in a word line direction, each upper semiconductor layer strip electrically connecting a shared bit line through one or more drain regions in said upper semiconductor layer strip to NAND flash strings from different word lines.

8. The non-volatile memory device of claim 7, where the plurality of upper semiconductor layer strips electrically connect a shared body line through body line contact regions in said upper semiconductor layer strips to NAND flash strings sharing one or more common word lines.

9. The non-volatile memory device of claim 1, where the upper semiconductor layer comprises alternating first and second connection strips running in the bit line direction and formed in a continuous semiconductor layer, where each first connection strip is formed over a column of NAND flash strings and comprises a horizontal string body region connected to each underlying NAND flash string, and a drain region connected to each horizontal string body region for electrically connecting a bit line through said drain region and horizontal string body region to said underlying NAND flash string; and where each second connection strip is formed adjacent to a corresponding first connection strip and comprises a body line contact region connected to each horizontal string body region in the corresponding first connection strip for electrically connecting a body line through said body line contact region and each connected horizontal string body region to said underlying NAND flash string.

10. The non-volatile memory device of claim 9, where the upper semiconductor layer comprises a plurality of first connection strips formed over a corresponding plurality of NAND flash string columns running in a bit line direction, and a plurality of second connection strips formed between the plurality of first connection strips for electrically connecting one or more shared body line conductors through body line contact regions formed in each second connection strip to the plurality of NAND flash strings.

11. The non-volatile memory device of claim 1, where the drain region comprises an n+ doped region formed in the upper semiconductor layer to be laterally offset from the vertical channel string body, and where the body line contact region comprises a p+ doped region formed in the upper semiconductor layer to be laterally offset from the vertical channel string body.

12. A NAND Flash memory cell array formed on a substrate comprising a plurality of semiconductor string bodies running in a direction perpendicular to a surface of the substrate, where each semiconductor string body is connected between an n-type source region formed in the substrate and an upper semiconductor layer formed over the substrate, where each upper semiconductor layer comprises:

a horizontal string body region connected to and formed over an associated semiconductor string body, an n-type conductivity region connected through each horizontal string body region to the associated semiconductor string body, and a p-type conductivity region connected through each horizontal string body region to the associated semiconductor string body, where the n-type conductivity region and p-type conductivity region are each laterally offset from the associated semiconductor string body.

13. The NAND Flash memory cell array of claim 12, further comprising an upper select gate formed at an upper end of each semiconductor string body, each of said upper select gates controlling a first channel portion formed in the horizontal string body region that runs parallel to the surface of the substrate and a second channel portion formed in the semiconductor string body that runs perpendicular to the surface of the substrate.

14. The NAND Flash memory cell array of claim 13, where the upper select gate is located between the first channel portion and the surface of the substrate.

15. The NAND Flash memory cell array of claim 13, wherein each upper select gate is positioned upon application of a first voltage to induce n-type conductivity in the first and second channel portions to electrically connect the first channel portion to an associated n-type conductivity region in the upper semiconductor layer.

16. The NAND Flash memory cell array of claim 13, wherein each upper select gate is positioned upon application of a second voltage to induce p-type conductivity in the first and second channel portions to electrically connect the first channel portion to an associated p-type conductivity region in the upper semiconductor layer.

17. The NAND Flash memory cell array of claim 12, where each n-type conductivity region is electrically connected to a first conductive line, and where each p-type conductivity connective region is electrically connected to a second conductive line.

18. The NAND Flash memory cell array of claim 17, wherein said first conductive line comprises a bit line for transferring data bits to or from one or more semiconductor string bodies, and wherein said second conductive line comprises a body line for transferring a positive voltage to one or more semiconductor string bodies.

19. A method for reading an addressed memory cell transistor from a plurality of NAND flash strings, each comprising a vertical channel string body in which a plurality of series-connected transistors are formed between a substrate source line region and an upper semiconductor layer, the plurality of series-connected transistors comprising an upper select gate transistor, a lower select gate transistor, and a plurality of memory cell transistors formed between the upper and lower select gate transistors, comprising:

applying a bit line read voltage to a bit line conductor which is connected through an n-type string drain region formed in the upper semiconductor layer to a selected flash string on which the addressed memory cell transistor is formed;

applying a body voltage to a body line conductor which is connected through a p-type string region formed in the upper semiconductor layer to the selected flash string on which the addressed memory cell transistor is formed; and applying a read gate voltage to the addressed memory cell transistor while otherwise applying a positive gate voltage to the other series-connected transistors formed on the selected flash string, thereby reading a value from the addressed memory cell transistor that is transferred through the n-type string drain region formed in the upper semiconductor layer and to the bit line conductor under control of the upper select gate transistor for the selected flash string.

20. The method of claim 19, where applying the positive gate voltage to the other series-connected transistors comprises applying the positive gate voltage to an upper select gate formed at an upper end of the selected flash string to control a first channel portion of a horizontal string body region formed in the upper semiconductor layer and a second channel portion of a vertical string body formed in the selected flash string.

21. A method for erasing an erase block of NAND flash strings, each comprising a vertical channel string body in which a plurality of series-connected transistors are formed between a substrate source line region and an upper semiconductor layer, the plurality of series-connected transistors comprising an upper select gate transistor, a lower select gate transistor, and a plurality of memory cell transistors formed between the upper and lower select gate transistors, comprising:

applying a large positive erase voltage to a body line conductor which is connected through p-type string regions formed in the upper semiconductor layer to the erase block of NAND flash strings, thereby charging the vertical channel string bodies in the erase block of NAND flash strings;

applying a smaller erase gate voltage to the plurality of series-connected transistors formed on the erase block of NAND flash strings; and floating the substrate source line and one or more bit line conductors which are connected through an n-type string drain regions formed in the upper semiconductor layer to the erase block of NAND flash strings.

*22. A flash memory device comprising*

*a semiconductor substrate;*

*a plurality of word lines running parallel to the semiconductor substrate;*

*a plurality of bit lines running parallel to the semiconductor substrate and perpendicular to the plurality of word lines;*

*a plurality of pillars extending perpendicularly from the semiconductor substrate, each pillar comprising a stacked plurality of memory cells and having a top portion remote from the semiconductor substrate; and*

*a connection layer comprising semiconducting material, the connection layer being spaced apart from the semiconductor substrate, the connection layer being continuous on a plane that is parallel to the plurality of word lines and parallel to the plurality of bit lines, the connection layer being directly connected to top portions of at least four of the plurality of pillars in a first direction and to top portions of at least four of the plurality of pillars in a second direction that is different from the first direction.*

*23. The flash memory device of claim 22, wherein the connection layer is electrically connected to a bit line.*

*24. The flash memory device of claim 22, wherein the connection layer is electrically connected to a body line.*

*25. The flash memory device of claim 22, wherein the semiconducting material of the connection layer comprises a polysilicon semiconductor material.*

*26. The flash memory device of claim 22, wherein the connection layer comprises an N-type doped region.*

* * * * *